(12) United States Patent
Hirano et al.

(10) Patent No.: US 11,391,756 B2
(45) Date of Patent: Jul. 19, 2022

(54) PROBE MODULE AND PROBE

(71) Applicant: Hitachi High-Tech Corporation, Tokyo (JP)

(72) Inventors: Ryo Hirano, Tokyo (JP); Takayuki Mizuno, Tokyo (JP); Tomohisa Ohtaki, Tokyo (JP); Toru Fujimura, Tokyo (JP); Shigehiko Kato, Tokyo (JP); Yasuhiko Nara, Tokyo (JP); Katsuo Ohki, Tokyo (JP); Akira Kageyama, Tokyo (JP); Masaaki Komori, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/967,328

(22) PCT Filed: Feb. 6, 2018

(86) PCT No.: PCT/JP2018/003988
§ 371 (c)(1),
(2) Date: Aug. 4, 2020

(87) PCT Pub. No.: WO2019/155520
PCT Pub. Date: Aug. 15, 2019

(65) Prior Publication Data
US 2021/0033642 A1 Feb. 4, 2021

(51) Int. Cl.
*G01R 31/28* (2006.01)
*G01R 1/067* (2006.01)
*G01R 3/00* (2006.01)

(52) U.S. Cl.
CPC ........... *G01R 1/06727* (2013.01); *G01R 3/00* (2013.01); *G01R 31/2856* (2013.01); *G01R 31/2863* (2013.01); *G01R 31/2879* (2013.01)

(58) Field of Classification Search
CPC .................. G01R 1/07307; G01R 1/07342
See application file for complete search history.

(56) References Cited

U.S. PATENT DOCUMENTS

| 4,749,947 A | 6/1988 | Gheewala |
| 5,917,197 A | 6/1999 | Alswede et al. |
| (Continued) | | |

FOREIGN PATENT DOCUMENTS

| CN | 1747071 A | 3/2006 |
| CN | 101949961 A | 1/2011 |
| (Continued) | | |

OTHER PUBLICATIONS

Taiwanese-language Office Action issued in Taiwanese Application No. 108102860 dated Oct. 8, 2019 (seven (7) pages).

(Continued)

*Primary Examiner* — Tung X Nguyen
(74) *Attorney, Agent, or Firm* — Crowell & Moring LLP

(57) ABSTRACT

As a semiconductor device is miniaturized, a scribe area on a wafer also tends to decrease. Accordingly, it is necessary to reduce the size of a TEG arranged in the scribe area, and efficiently arrange an electrode pad for probe contact. Therefore, it is necessary to associate probes and the efficient layout of the electrode pad. The purpose of the present invention is to provide a technique for associating probes and the layout of an electrode pad of a TEG to facilitate the evaluation of electrical characteristics. According to the present invention, the above described problem can be solved by arranging a plurality of probes in a fan shape or manufacturing the probes with micro electro mechanical systems (MEMS) technology.

13 Claims, 40 Drawing Sheets

(56) References Cited

U.S. PATENT DOCUMENTS

| | | |
|---|---|---|
| 2002/0149120 A1 | 10/2002 | Sugiyama |
| 2002/0178800 A1 | 12/2002 | Hasegawa et al. |
| 2003/0006795 A1 | 1/2003 | Asayama et al. |
| 2003/0141889 A1* | 7/2003 | Chen ................ G01R 1/07342 324/750.16 |
| 2003/0213953 A1 | 11/2003 | Sohn et al. |
| 2004/0140467 A1 | 7/2004 | Kimura et al. |
| 2005/0139781 A1 | 6/2005 | Hazaki et al. |
| 2005/0282360 A1 | 12/2005 | Kida et al. |
| 2006/0060779 A1 | 3/2006 | Park et al. |
| 2006/0207317 A1* | 9/2006 | Watanabe ............ G01Q 60/40 73/105 |
| 2007/0245553 A1 | 10/2007 | Chong et al. |
| 2009/0243645 A1 | 10/2009 | Shinkawata |
| 2009/0302869 A1* | 12/2009 | Bonin ................ G01R 1/06794 324/662 |
| 2013/0113512 A1* | 5/2013 | Ogasawara ........ G01R 1/06772 324/755.11 |
| 2014/0266280 A1 | 9/2014 | Yeh et al. |

FOREIGN PATENT DOCUMENTS

| | | |
|---|---|---|
| JP | 62-290144 A | 12/1987 |
| JP | 4-100252 A | 4/1992 |
| JP | 6-163655 A | 6/1994 |
| JP | 10-335398 A | 12/1998 |
| JP | 2002-217258 A | 8/2002 |
| JP | 2002-313864 A | 10/2002 |
| JP | 2004-226086 A | 8/2004 |
| JP | 2005-189239 A | 7/2005 |
| JP | 2007-121317 A | 5/2007 |
| JP | 2009-206272 A | 9/2009 |
| JP | 2009-239101 A | 10/2009 |
| JP | 2013-187510 A | 9/2013 |
| TW | 472182 B | 1/2002 |
| TW | 543133 B | 7/2003 |
| TW | I223369 B | 11/2004 |
| TW | 200605206 A | 2/2006 |
| TW | 201400819 A | 1/2014 |
| TW | 201435348 A | 9/2014 |

OTHER PUBLICATIONS

International Search Report (PCT/ISA/210) issued in PCT Application No. PCT/JP2018/003987 dated May 15, 2018 with English translation (eight (8) pages).
Japanese-language Written Opinion (PCT/ISA/237) issued in PCT Application No. PCT/JP2018/003987 dated May 15, 2018 (five (5) pages).
International Search Report (PCT/ISA/210) issued in PCT Application No. PCT/JP2018/003988 dated May 15, 2018 with English translation (eight (8) pages).
Japanese-language Written Opinion (PCT/ISA/237) issued in PCT Application No. PCT/JP2018/003988 dated May 15, 2018 (five (5) pages).
Taiwanese-language Office Action issued in Taiwanese Application No. 108102826 dated Nov. 29, 2019 with English translation (12 pages).
Taiwanese-language Office Action issued in Taiwanese Application No. 108102826 dated May 27, 2020 with English translation (seven (7) pages).
International Search Report (PCT/ISA/210) issued in PCT Application No. PCT/JP2018/003986 dated May 15, 2018 with English translation (nine (9) pages).
Japanese-language Written Opinion (PCT/ISA/237) issued in PCT Application No. PCT/JP2018/003986 dated May 15, 2018 (five (5) pages).
Taiwanese-language Office Action issued in Taiwanese Application No. 108102861 dated Oct. 24, 2019 (seven (7) pages).
Taiwanese-language Office Action issued in Taiwanese Application No. 108102860 dated Aug. 30, 2021 with partial English translation (11 pages).
Japanese-language Office Action issued in Japanese Application No. 2019-571136 dated Oct. 5, 2021 with English translation (six (6) pages).
Korean-language Office Action issued in Korean Application No. 10-2020-7020158 dated Sep. 23, 2021 with English translation (15 pages).
Korean-language Office Action issued in Korean Application No. 10-2020-7019583 dated Aug. 27, 2021 with English translation (13 pages).
Taiwanese-language Office Action issued in Taiwanese Application No. 108102861 dated Aug. 31, 2021 with partial English translation (nine (9) pages).
Japanese-language Office Action issued in Japanese Application No. 2019-571135 dated Oct. 5, 2021 with English translation (six (6) pages).
United States Non-final Office Action issued in U.S. Appl. No. 16/967,280 dated Oct. 5, 2021 (12 pages).
English translation of document B17 (JP 4-100252 A filed on Aug. 4, 2020) (five (5) pages).
English translation of document B8 (JP 6-163655 A filed on Aug. 4, 2020) (four (4) pages).
English translation of document B12 (JP 2007-121317 A filed on Aug. 4, 2020) (six (6) pages).
English translation of document B14 (JP 62-290144 A filed on Aug. 4, 2020) (three (3) pages).

* cited by examiner

[FIG. 1]
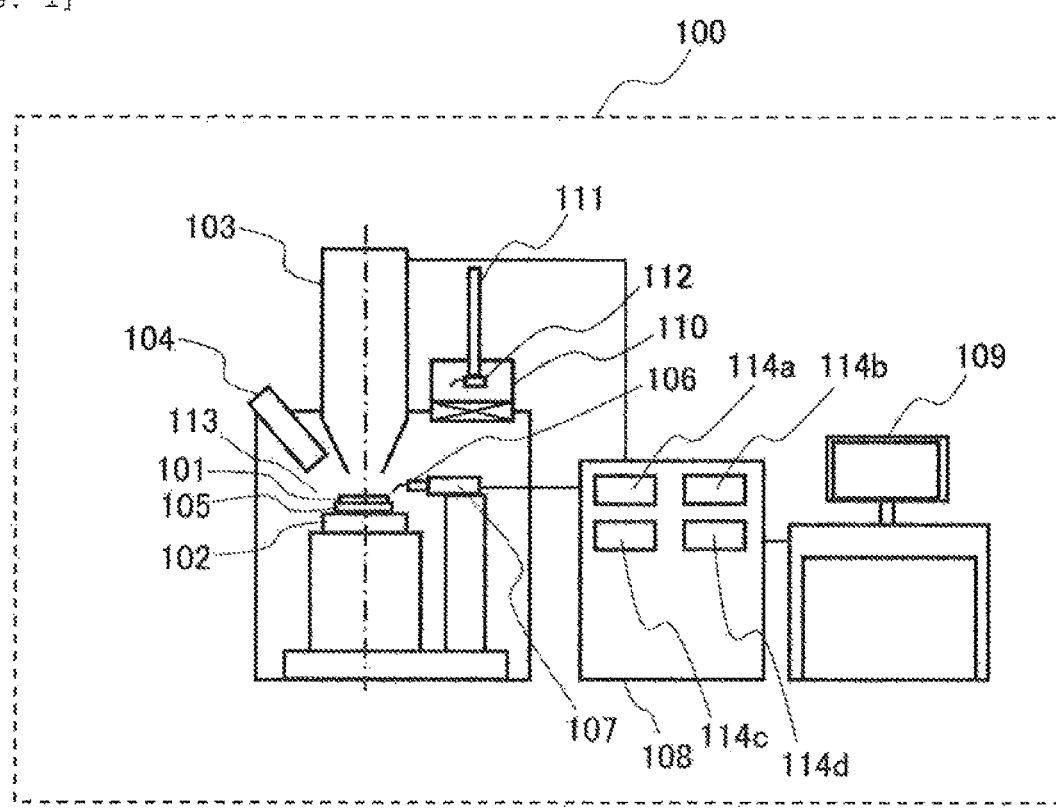
[FIG. 2]
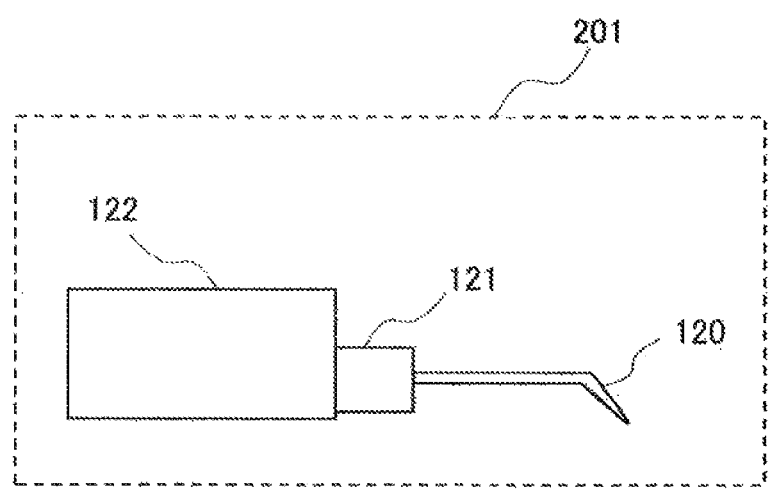

[FIG. 3]
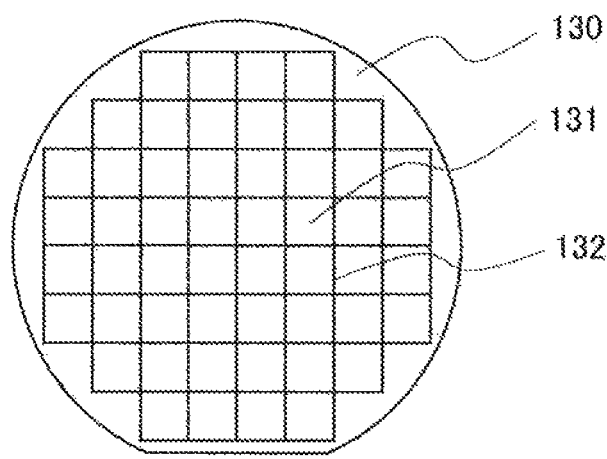
FIG. 4A
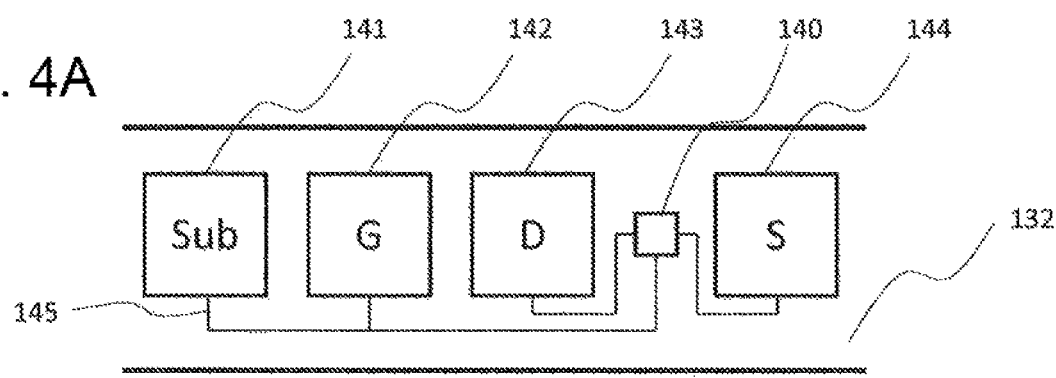
FIG. 4B
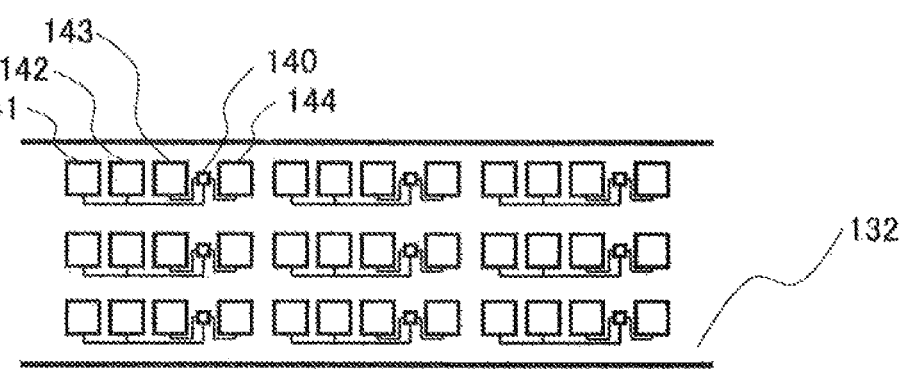

[FIG. 5]
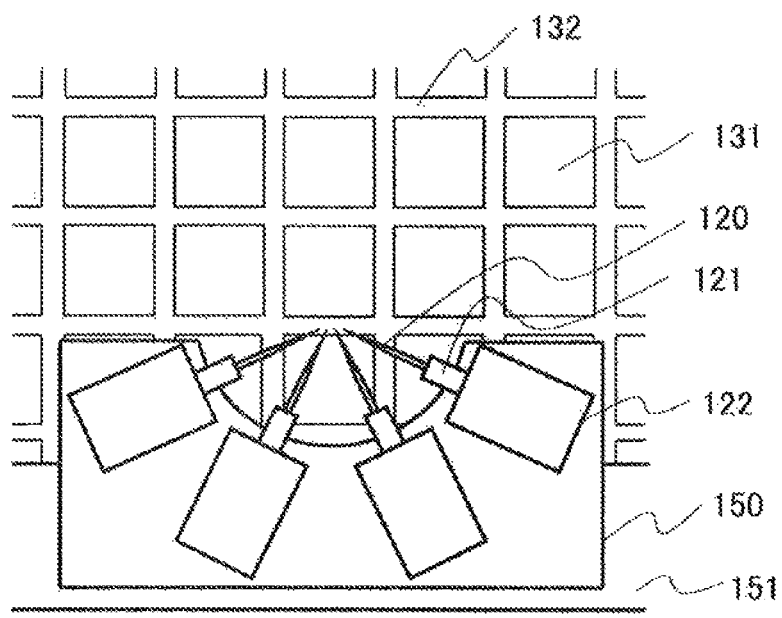
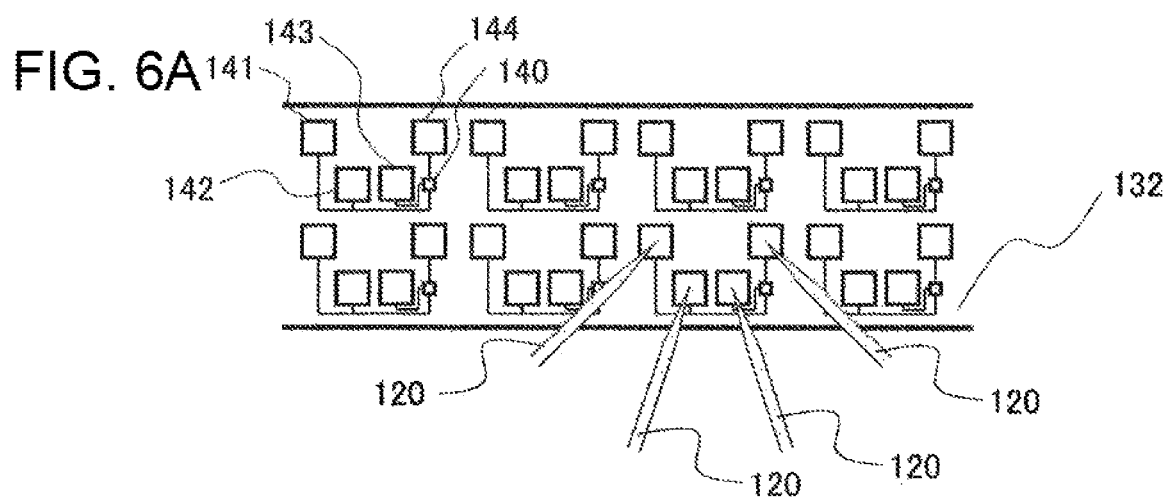
FIG. 6A

FIG. 8C
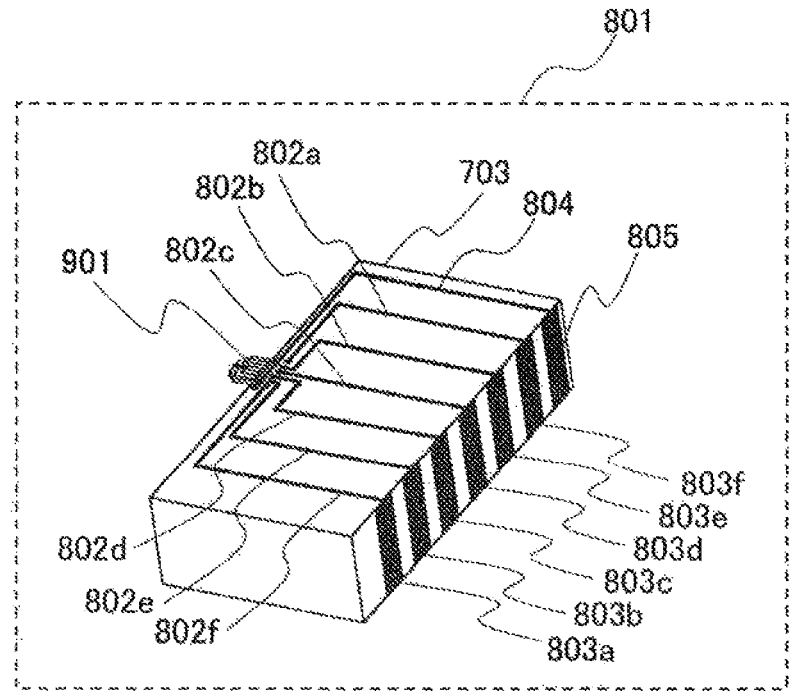
[FIG 9]
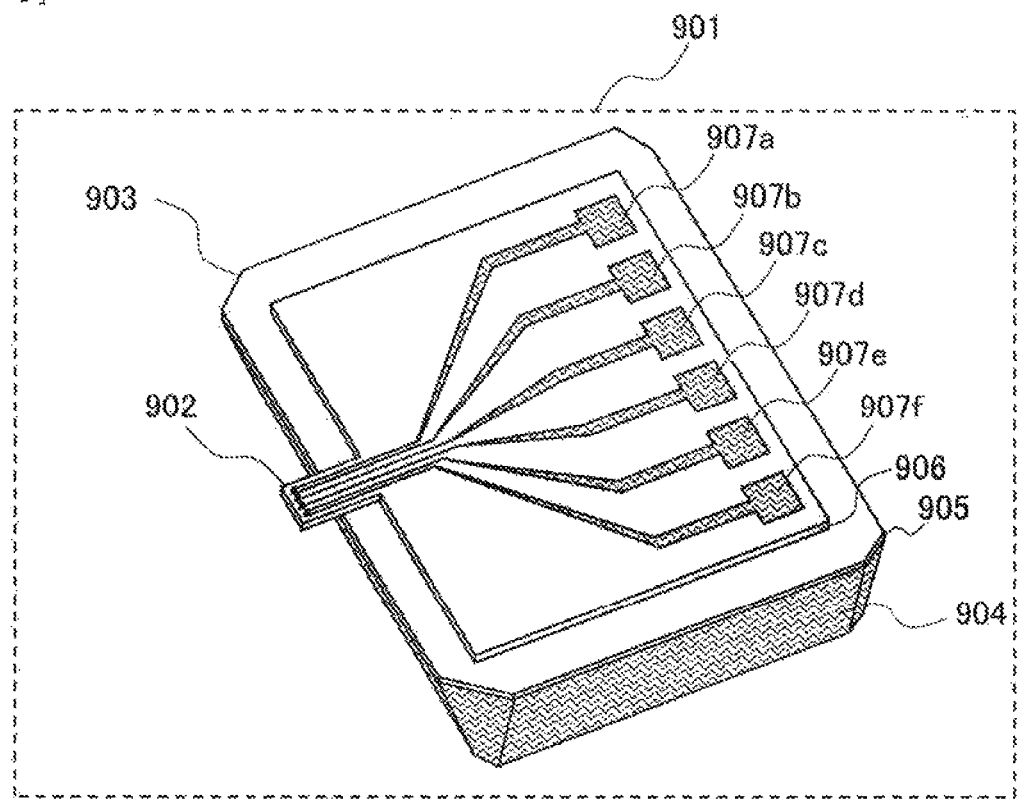

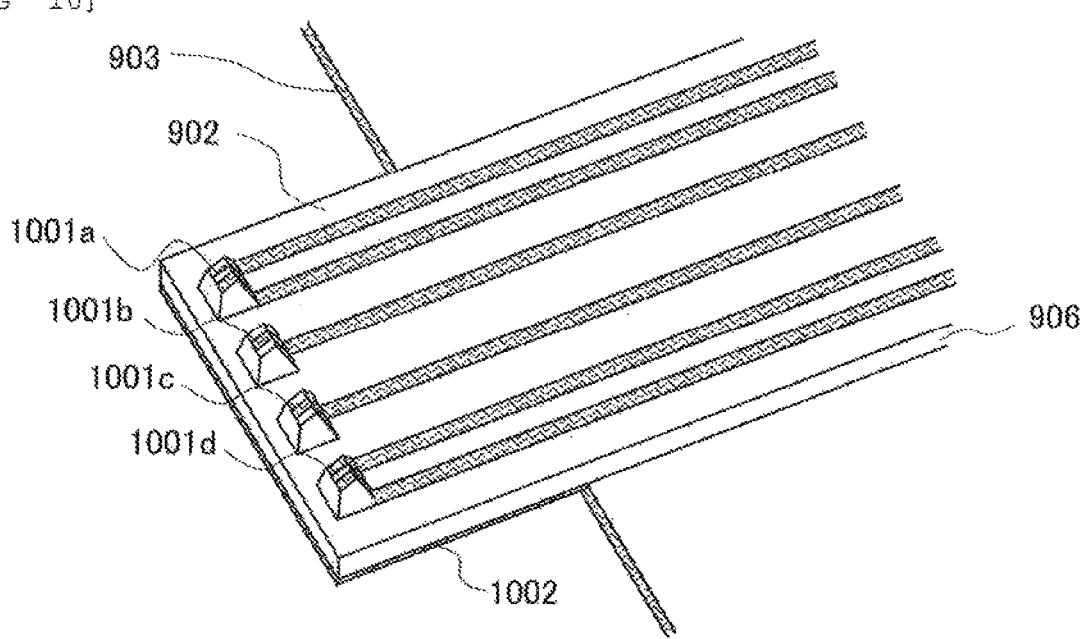
[FIG 10]

[FIG 11]
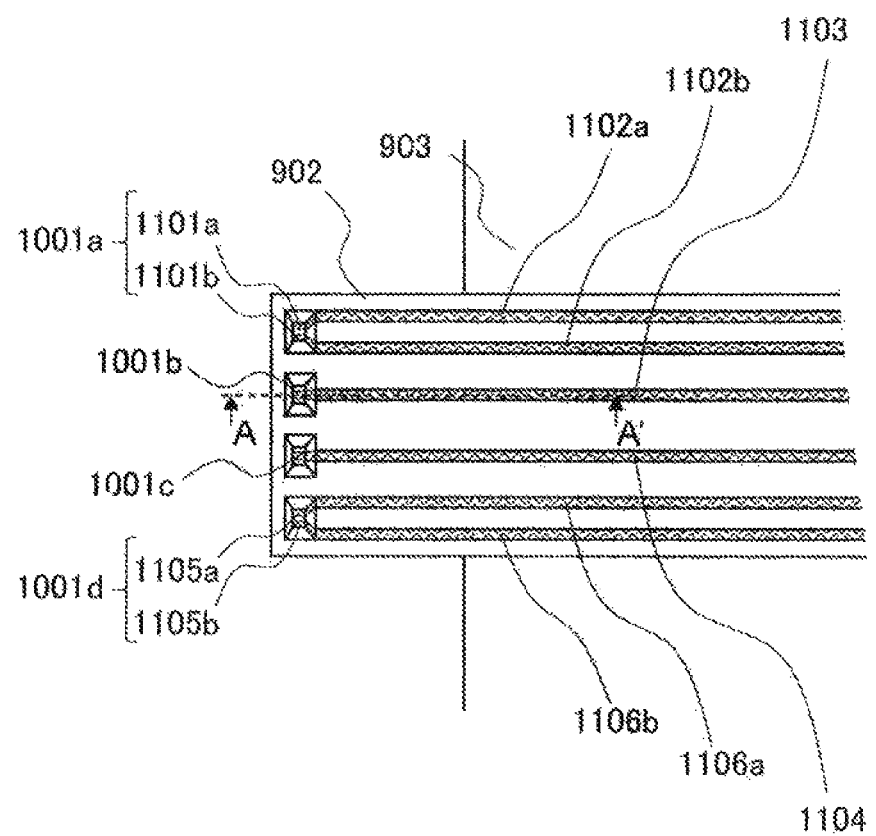

[FIG. 12]
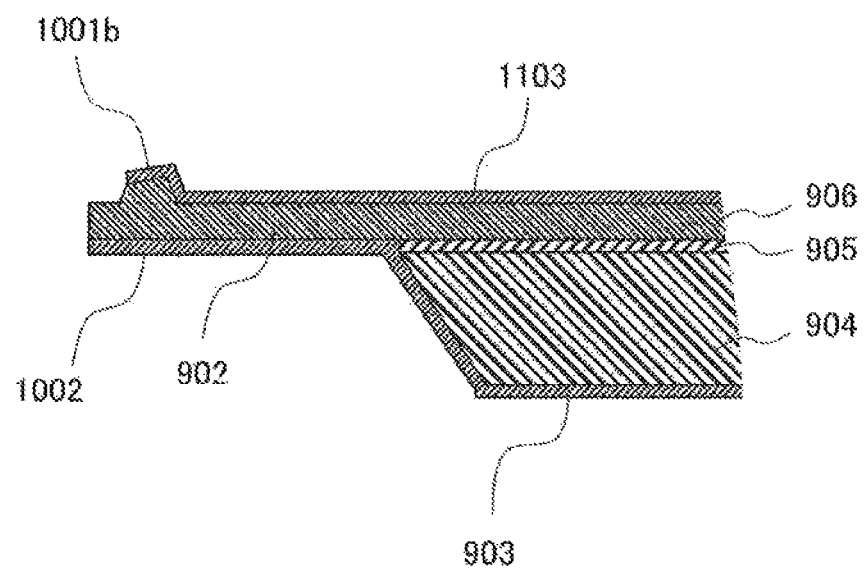

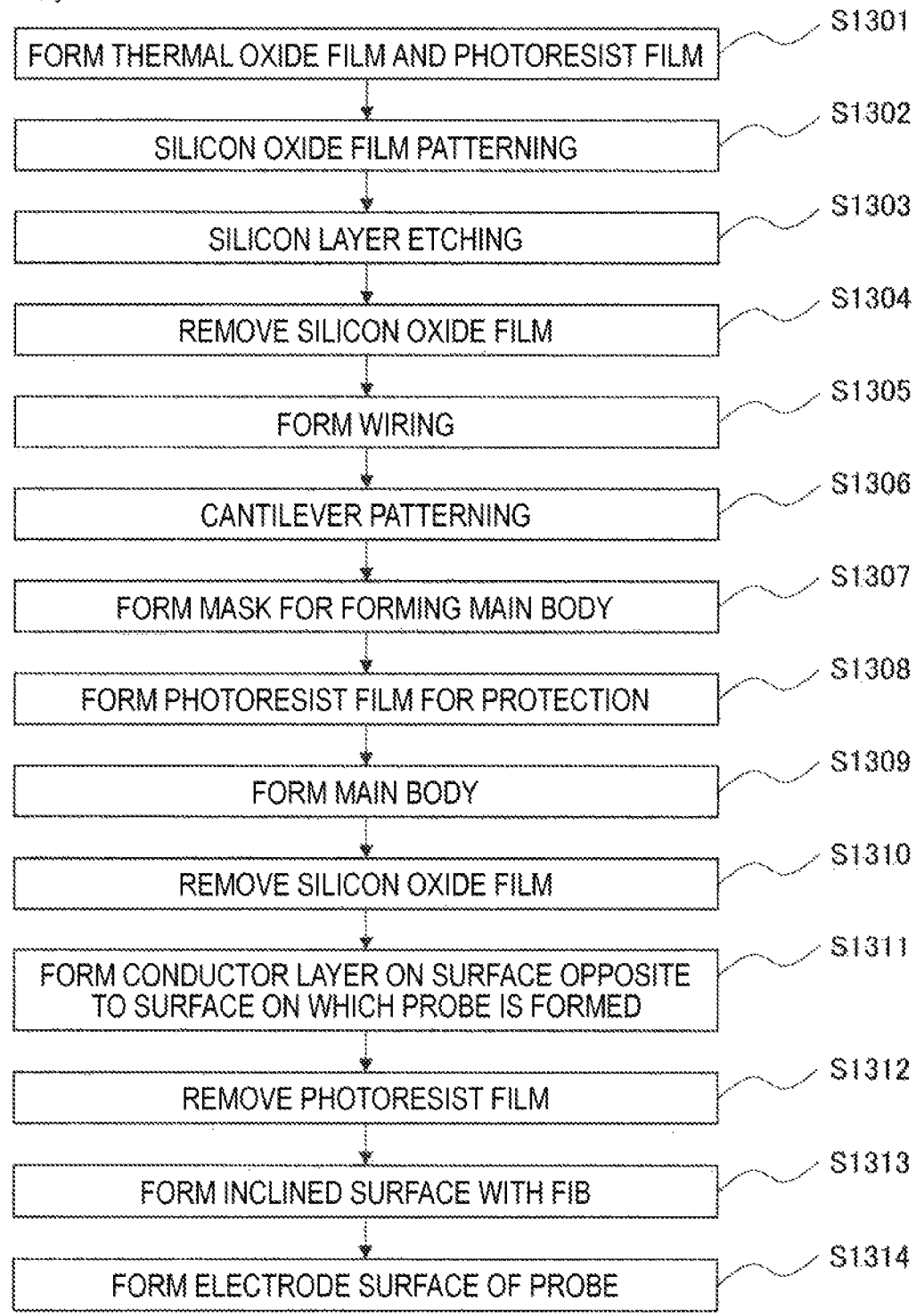

FIG. 14M
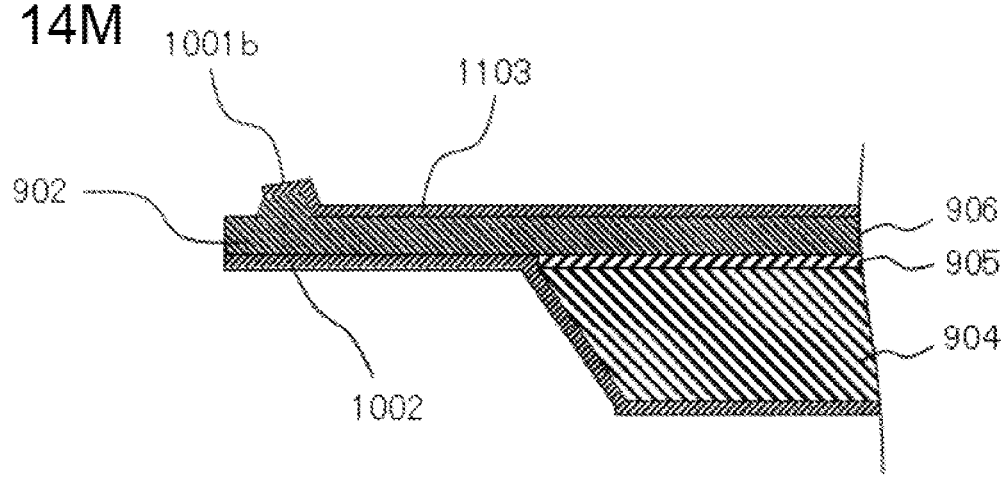
[FIG. 15]
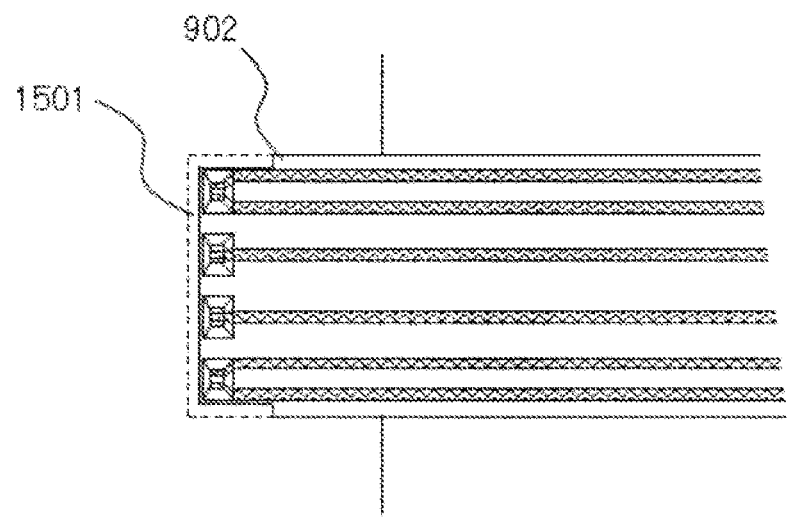

[FIG. 16]
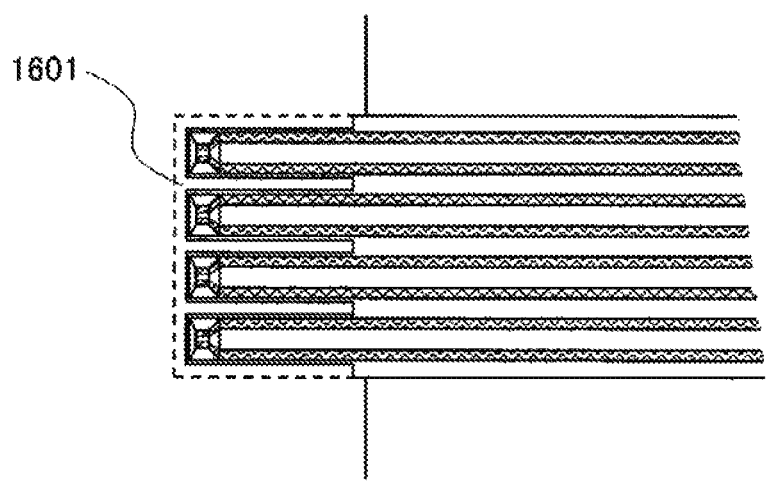

[FIG. 17]
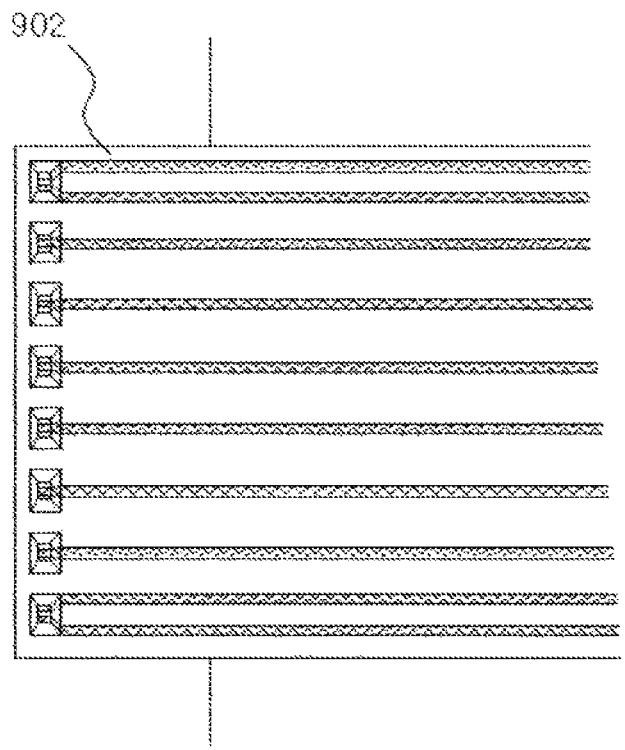

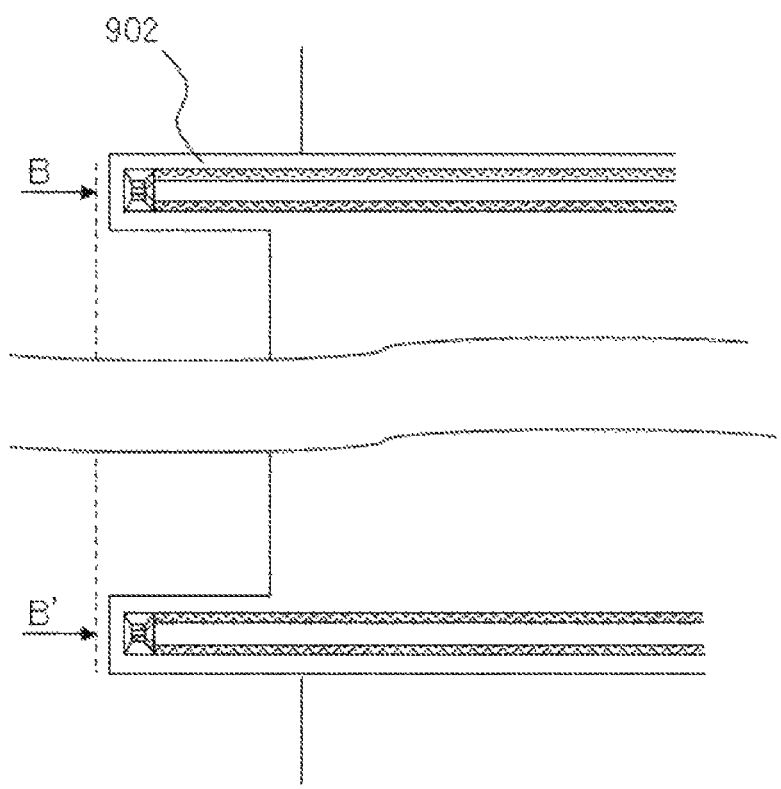
[FIG. 18]

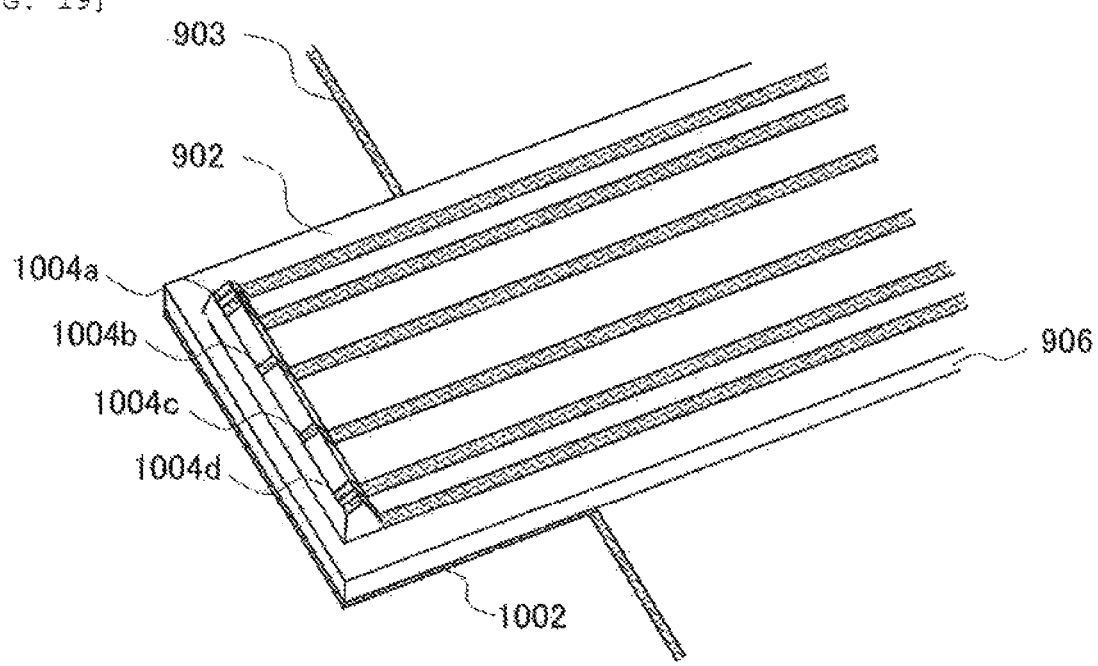
[FIG. 19]

[FIG. 20]
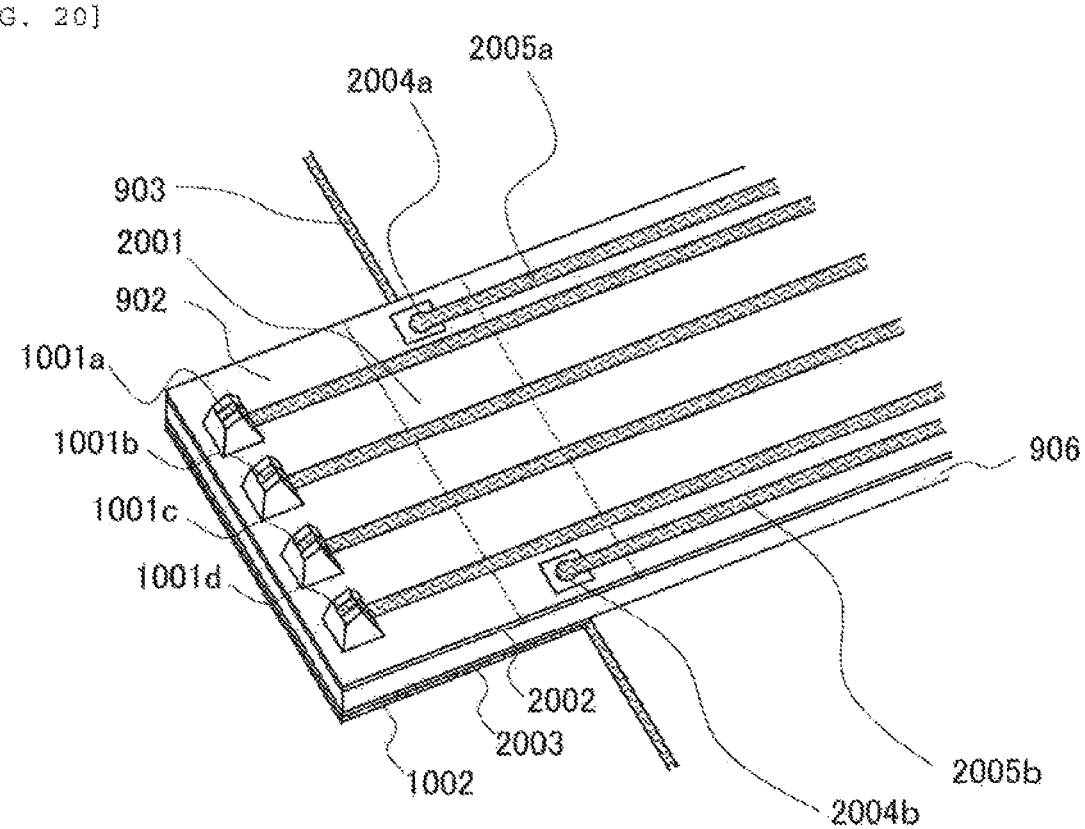

[FIG. 21]
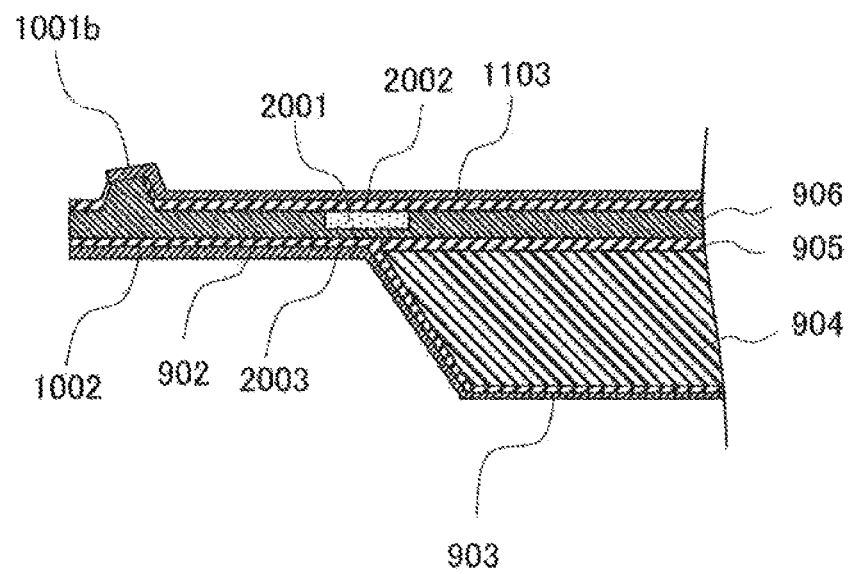

[FIG. 22]
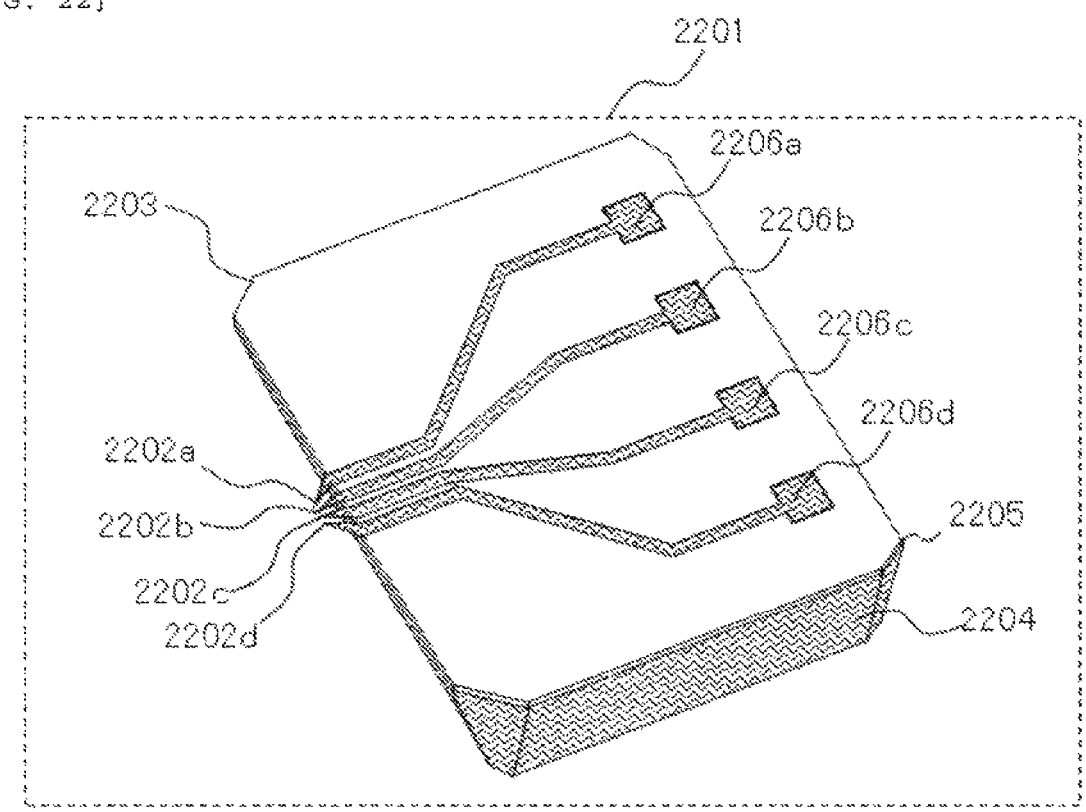

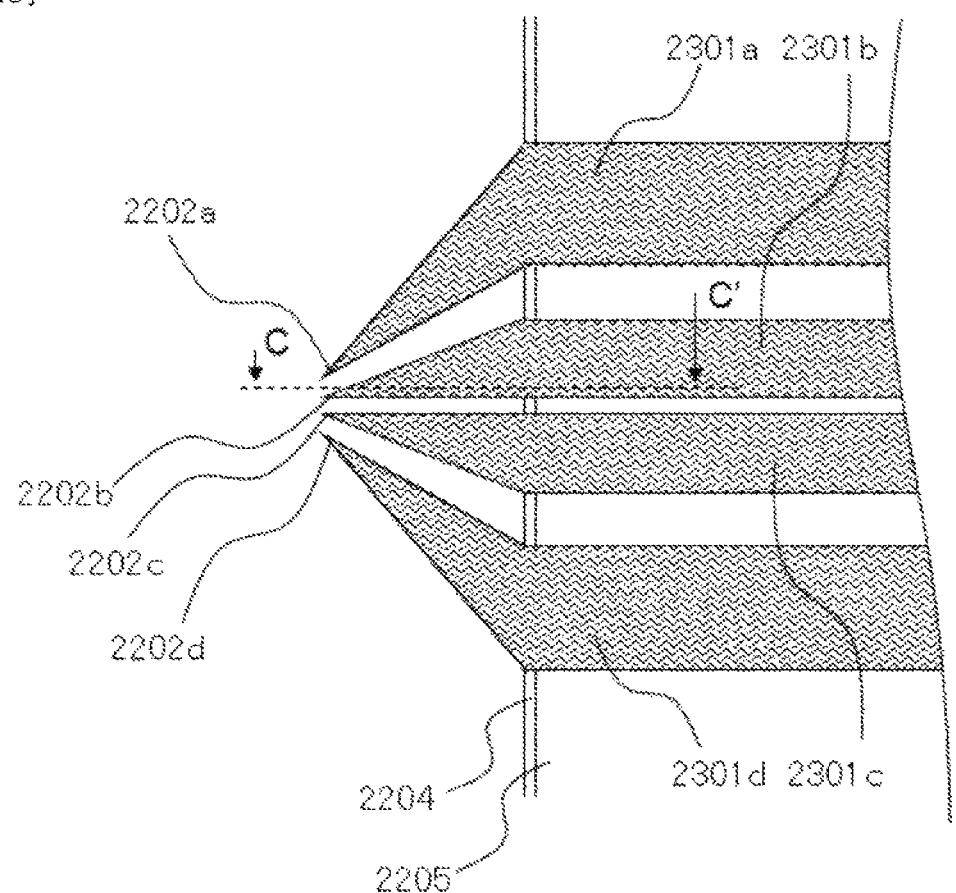
[FIG. 23]

[FIG. 24]
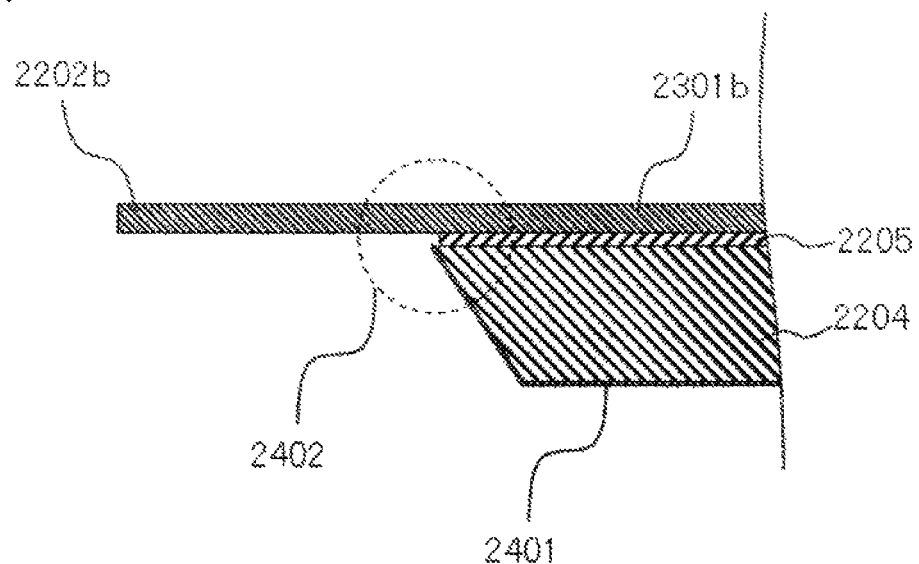
[FIG. 25]
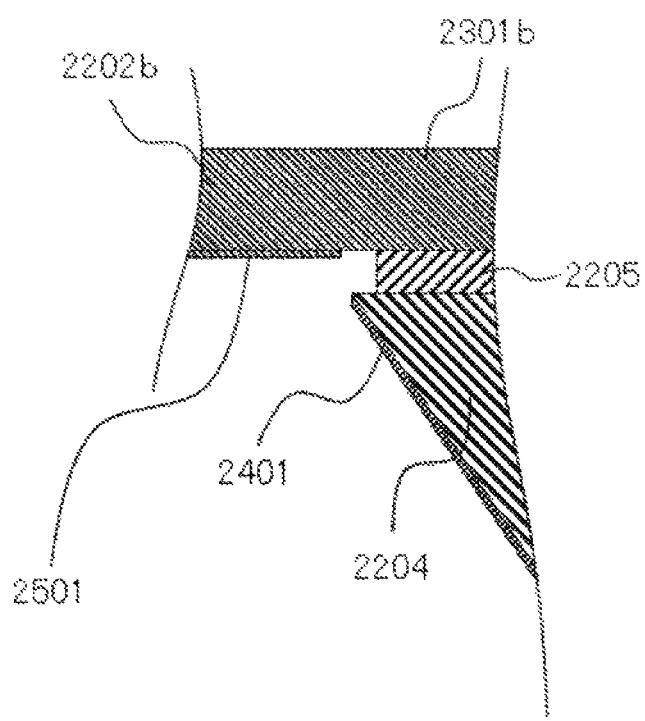

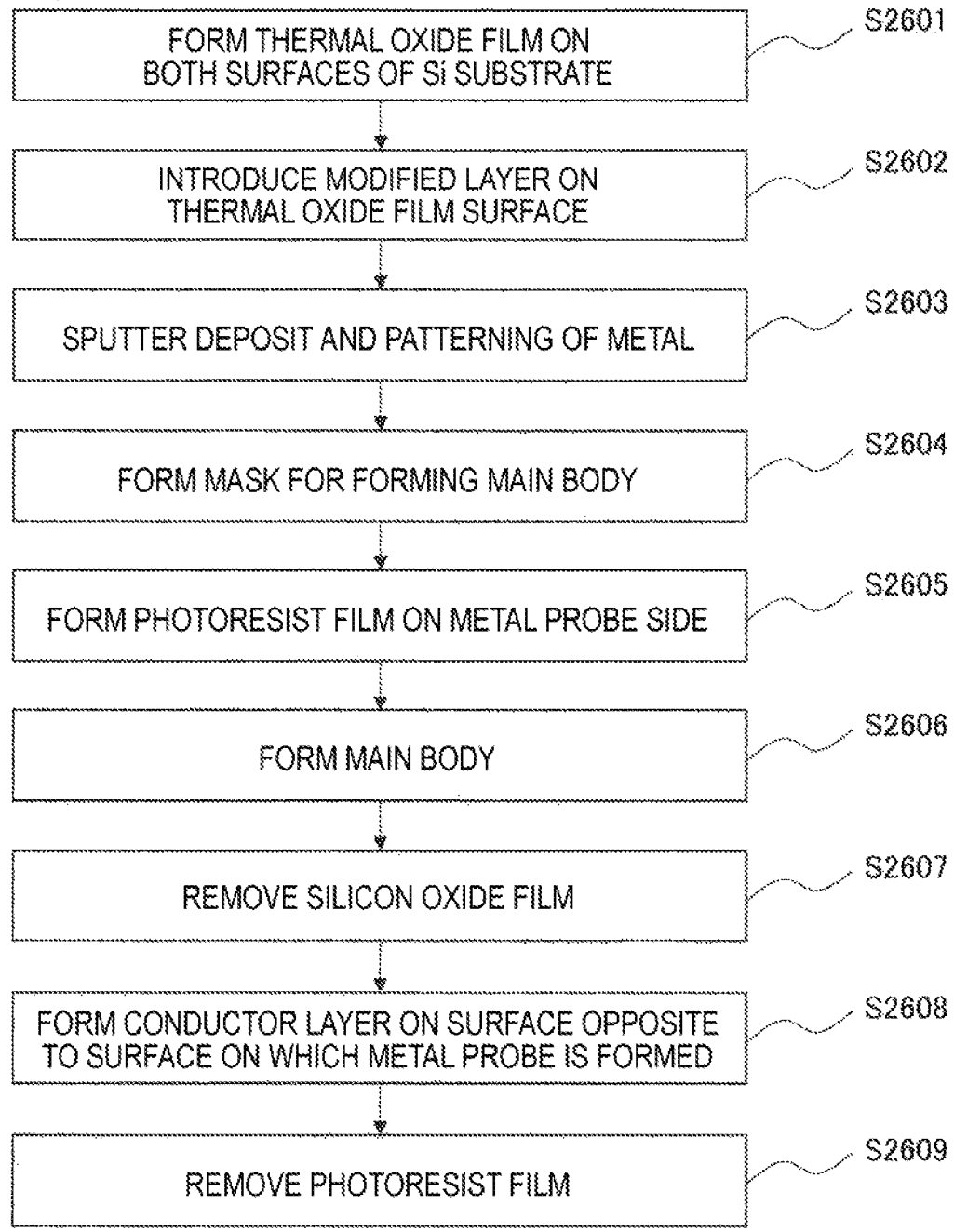
[FIG. 26]

FIG. 29B
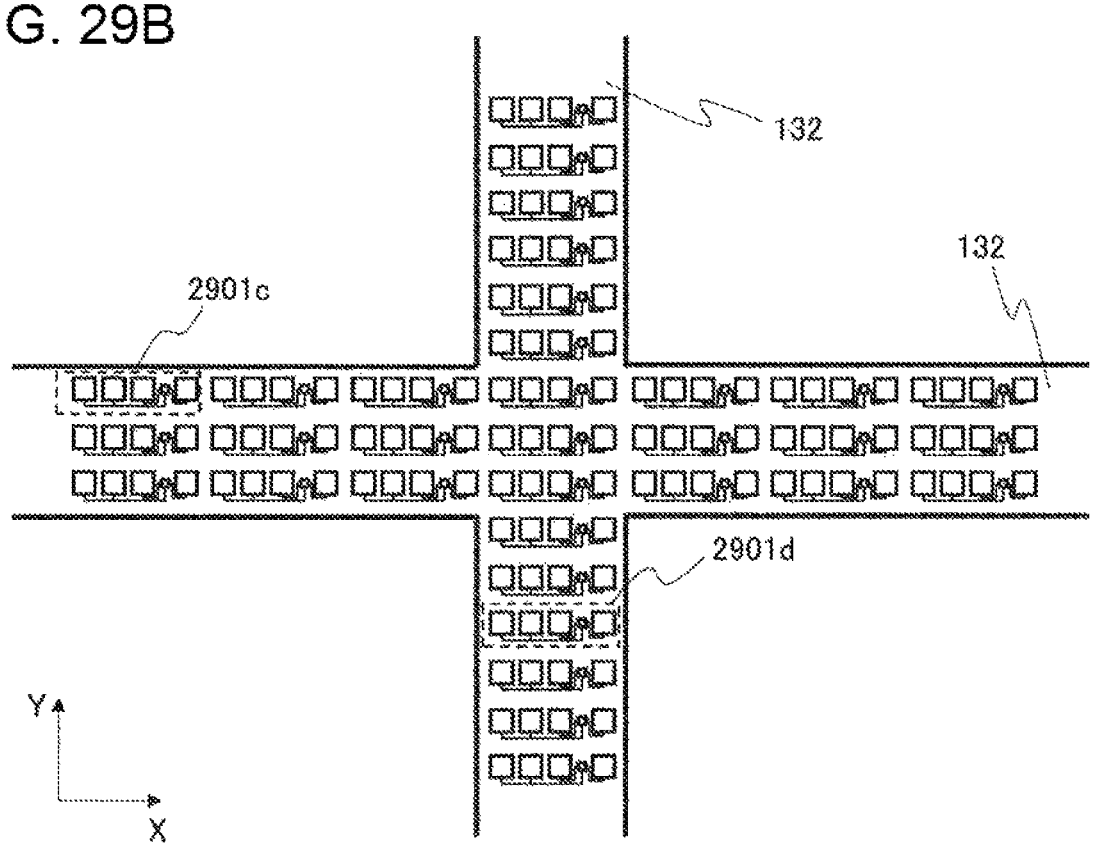
[FIG 30]
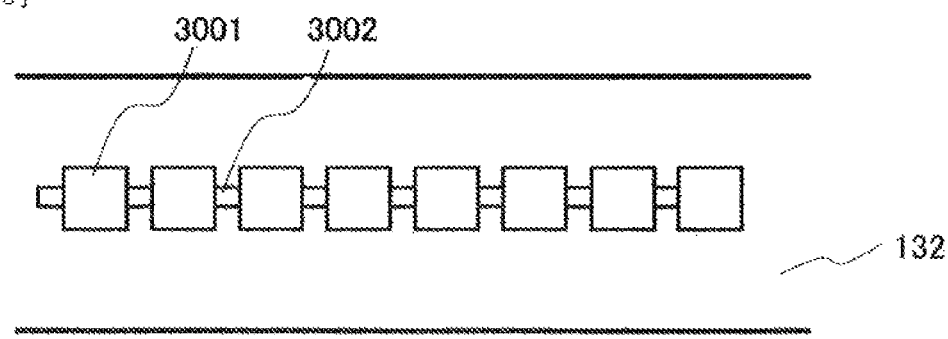

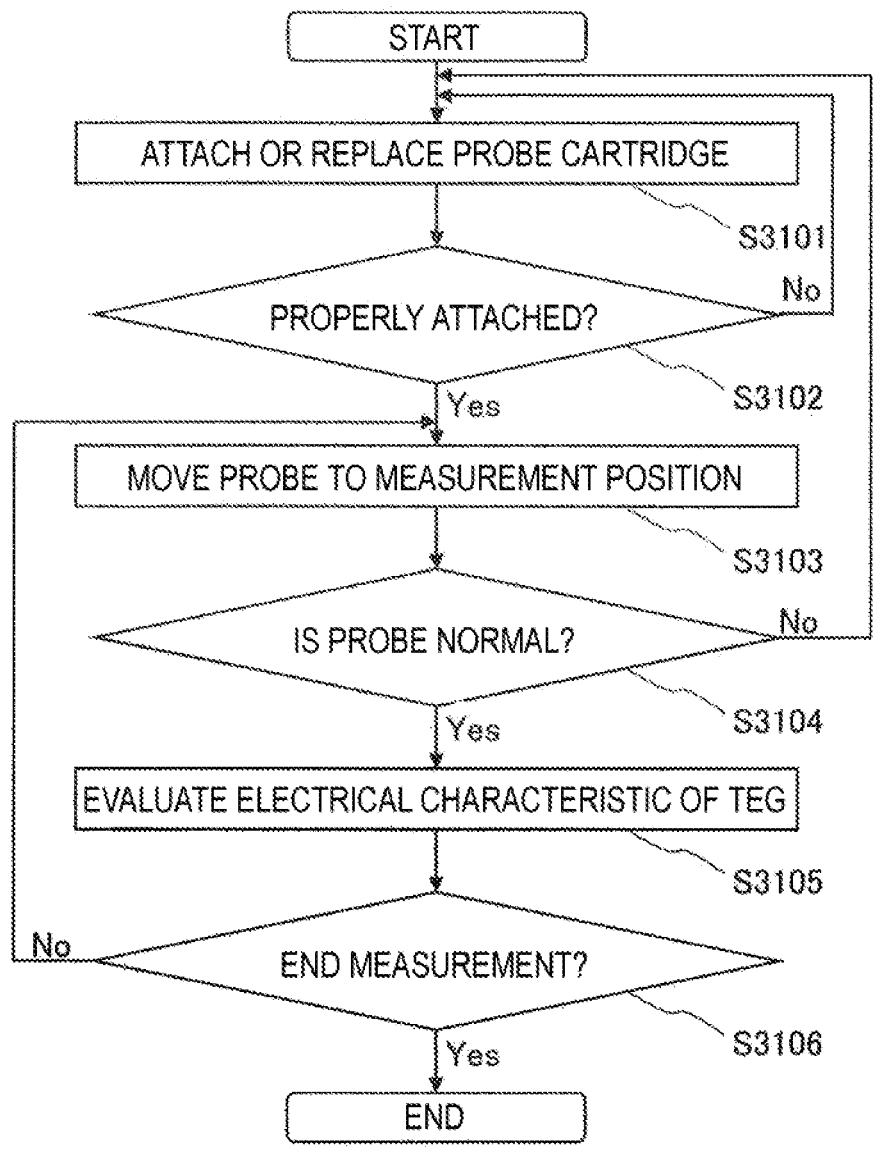
[FIG. 31]

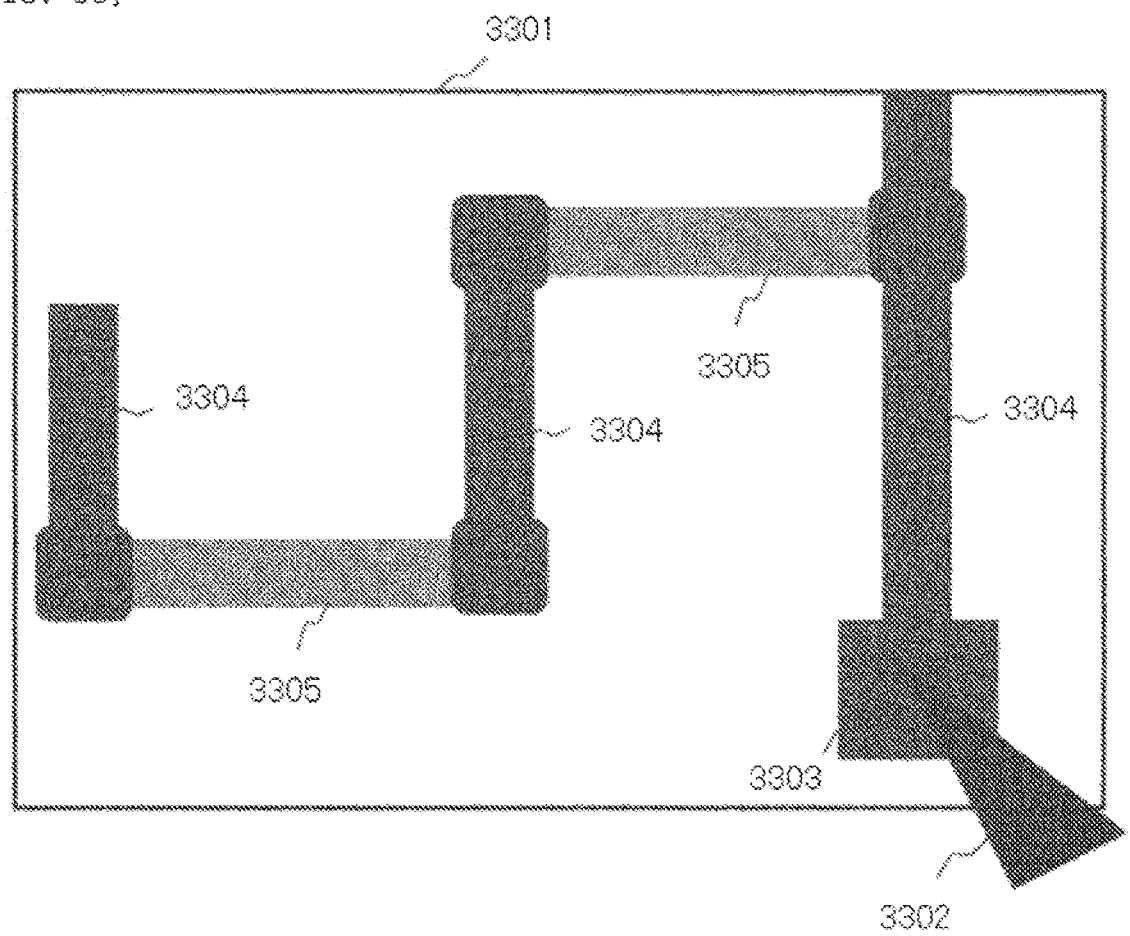
[FIG. 33]

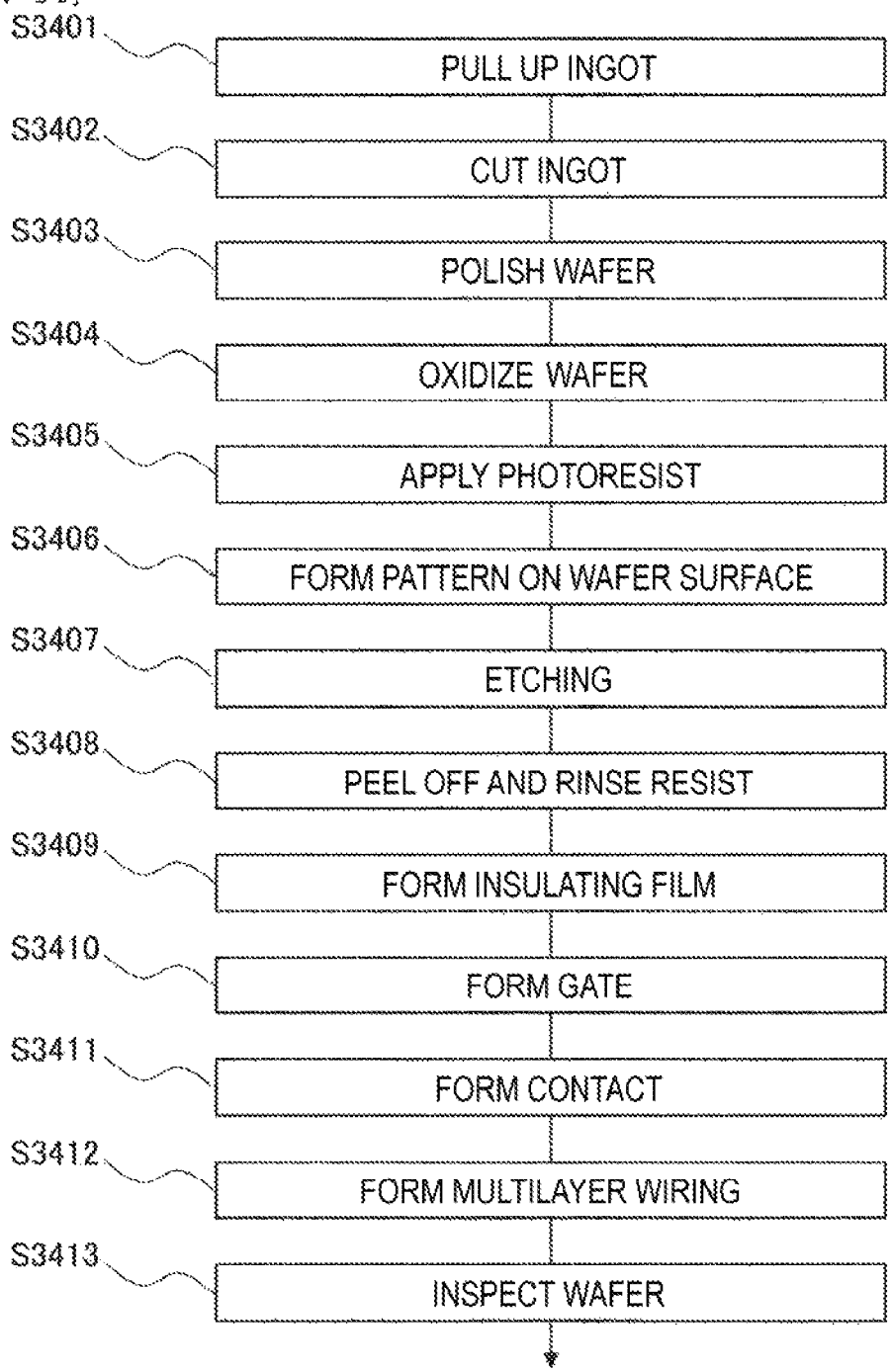

[FIG. 35]
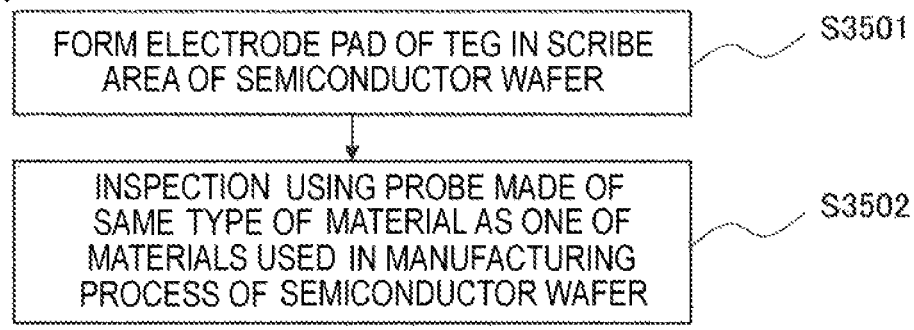

PROBE MODULE AND PROBE

TECHNICAL FIELD

The present invention relates to a method for manufacturing a semiconductor device.

BACKGROUND ART

In manufacturing a semiconductor device, a management technology of manufacturing process is important for improving product yields and throughputs. As an inspection device for process control, there is a device for directly contacting an examining instrument called a "probe" with a sample to evaluate electrical characteristics.

There is disclosed in JP-A-2002-217258 (PTL 1) a technique capable of improving the yield of semiconductor devices by measuring a large number of evaluation samples (Test Element Group; hereinafter, referred to as "TEG") arranged in a scribe area of a semiconductor wafer. There is disclosed in JP-A-2005-189239 (PTL 2) a technology that includes a sample exchange chamber connected to a sample chamber and temporarily storing a sample and a transport unit that transports the sample between the sample exchange chamber and the sample chamber, and a probe image acquiring device provided in parallel with an electron optical system device, and that moves a sample stage and a probe unit in a horizontal direction between a vertical position of the probe image acquiring device and a vertical position of the electron optical system device. There is disclosed in JP-A-2013-187510 (PTL 3) a semiconductor inspection apparatus configured to include a charged particle optical system that irradiates a charged particle beam onto a sample wafer, a sample stage that freely moves in a sample chamber, a prober stage mounted with a prober provided with a probe needle and freely moved in a sample chamber, an image acquisition unit that acquires an optical image of the sample wafer, while moving the position of a prober, a charged particle image acquisition unit that, when scanning while irradiating a charged particle beam, acquires a charged particle image based on a detection signal of secondary charged particles emitted from the sample wafer, a current and voltage detection unit that detects a current or voltage obtained from the probe needle, and a control computer.

CITATION LIST

Patent Literature

PTL 1: JP-A-2002-217258
PTL 2: JP-A-2005-189239
PTL 3: JP-A-2013-187510

SUMMARY OF INVENTION

Technical Problem

As a semiconductor device is miniaturized, a scribe area on a wafer also tends to decrease. Accordingly, it is necessary to reduce the size of a TEG arranged in the scribe area, and efficiently arrange an electrode pad for probe contact. Therefore, it is necessary to associate the probes with the efficient layout of the electrode pad. In the techniques disclosed in PTLs 1 to 3, each probe is independently mounted, and it takes time to control each probe to contact the electrode pad.

The purpose of the present invention is to provide a technique for associating the probes and the layout of the electrode pads of a TEG so as to facilitate the evaluation of electrical characteristics.

Solution to Problem

According to the present invention, the above described problems can be solved by arranging a plurality of probes in a fan shape or manufacturing the probes with micro electro mechanical systems (MEMS) technology.

Advantageous Effects of Invention

According to the present invention, the layout of the electrode pad of TEG can be associated with the probes to facilitate the evaluation of electrical characteristics. As a result, productivity in the front-end process of manufacturing a semiconductor device can be improved.

BRIEF DESCRIPTION OF DRAWINGS

FIG. 1 is a schematic view of an electrical characteristic evaluation apparatus according to an embodiment of the present invention.
FIG. 2 is a schematic view of a probe module according to an embodiment of the present invention.
FIG. 3 is a schematic view of a semiconductor wafer as an example of a sample.
FIG. 4A is a view showing an example of an arrangement of electrode pads of a FET-TEG in a scribe area.
FIG. 4B is a view showing an example of an arrangement of electrode pads of a minute FET-TEG in a scribe area.
FIG. 5 is a view showing an example of an arrangement of a probe module.
FIG. 6A is a view showing an example of an arrangement of electrode pads of a FET-TEG in a scribe area.
FIG. 8C is a perspective view of the probe cartridge on the side facing the sample according to an embodiment of the present invention.
FIG. 9 is an overall perspective view of a MEMS probe according to an embodiment of the present invention.
FIG. 10 is a perspective view of a cantilever of the MEMS probe according to an embodiment of the present invention.
FIG. 11 is a plan view of the MEMS probe according to an embodiment of the present invention.
FIG. 12 is a cross-sectional view of the MEMS probe according to an embodiment of the present invention.
FIG. 13 is a flowchart showing a process of manufacturing the MEMS probe according to an embodiment of the present invention.

FIG. 14M is a view provided to explain a process of manufacturing the MEMS probe according to an embodiment of the present invention.

FIG. 15 is a plan view of the MEMS probe according to an embodiment of the present invention.

FIG. 16 is a plan view of the MEMS probe according to an embodiment of the present invention.

FIG. 17 is a plan view of the MEMS probe according to an embodiment of the present invention.

FIG. 18 is a plan view of the MEMS probe according to an embodiment of the present invention.

FIG. 19 is a perspective view of a cantilever of the MEMS probe according to an embodiment of the present invention.

FIG. 20 is a perspective view of the cantilever of the MEMS probe according to an embodiment of the present invention.

FIG. 21 is a cross-sectional view of the MEMS probe according to an embodiment of the present invention.

FIG. 22 is an overall perspective view of the MEMS probe according to an embodiment of the present invention.

FIG. 23 is a plan view of a MEMS probe according to an embodiment of the present invention.

FIG. 24 is a cross-sectional view of the MEMS probe according to an embodiment of the present invention.

FIG. 25 is a cross-sectional view of the MEMS probe according to an embodiment of the present invention.

FIG. 26 is a flowchart showing a process of manufacturing the MEMS probe according to an embodiment of the present invention.

FIG. 29B is a view showing an example of the FET-TEG arrangement in a scribe area.

FIG. 30 is a schematic view of an example of an electrode pad for checking the normality of each probe of a probe cartridge.

FIG. 31 shows an example of a flowchart of electrical characteristic evaluation using a probe cartridge.

FIG. 33 is a view showing an example of an absorption current image.

FIG. 34 is a view showing an example of a flow of a front-end process in a manufacturing process of a semiconductor device.

FIG. 35 is a view showing an example of a manufacturing process of a semiconductor device according to the present invention.

DESCRIPTION OF EMBODIMENTS

Figure 6B:
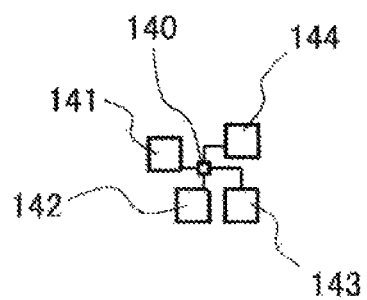
FIG. 6B is a view showing a modification of the arrangement of electrode pads of the FET-TEG in the scribe area.

In the following embodiments, when necessary for convenience, the description will be made by dividing into a plurality of sections or embodiments, and unless otherwise specified, these are related to each other, and one is in relation to some or all of the other, such as modifications, details, supplementary explanations, and the like. In all the drawings for describing the following embodiments, components having the same functions are denoted by the same reference numerals in principle, and repetitive description thereof will be omitted. Hereinafter, embodiments of the present invention will be described in detail with reference to the drawings.

First Embodiment

FIG. 1 shows an example of an electrical characteristic evaluation apparatus that can be used in a manufacturing process of a semiconductor device according to an embodiment of the present invention. The electrical characteristic evaluation apparatus 100 includes, in a vacuum chamber, a scanning electron microscope (hereinafter, referred to as SEM) lens barrel 103, a detector 104 that performs SEM observation, a sample stage 102 on which a sample 101 held on a sample holder 105 is mounted, a probe cartridge 106 to be in contact with the sample 101 to evaluate electric characteristic, a probe driving mechanism 107 that mounts and drives the probe cartridge 106, a probe exchanger 110 that exchanges the probe cartridge 106, a controller 108 that controls the SEM and the probe unit, a display device 109 that displays SEM images of the sample 101 and the probe cartridge 106, and a sample chamber 113.

The SEM lens barrel 103 includes an electron gun, a condenser lens, a movable stop, a deflector, and an objective lens. The electron gun includes an electron source for generating a primary electron beam, and the electron source may be of any type such as a filament method, a Schottky method, and a field emission method. The deflector is used to deflect the primary electron beam to scan the sample 101, and a magnetic field deflection type or an electrostatic deflection type is used. Generally, for the objective lens of the SEM lens barrel 103, a magnetic field lens using the converging action of electrons by magnetic field is used. The detector 104 may be mounted outside the SEM lens barrel 103 as shown in FIG. 1 or may be mounted inside the SEM lens barrel 103.

The sample stage 102 is driven by a motor, in the X, Y, and Z axis directions, and additionally, it is tilted, or rotated around the Z axis. Note that the X axis and the Y axis represent the horizontal direction, and the Z axis represents the direction orthogonal to the X axis and the Y axis. The probe driving mechanism 107 uses a piezoelectric element, and can drive the probe 106 at nano-order in the X, Y, and Z axis directions.

The probe exchanger 110 includes a spare probe cartridge 112 and a probe exchange mechanism 111. The probe exchanger 110 is connected to a preliminary exhaust system, and enables exchange of the probe cartridge 106 with the probe cartridge 112 without returning the sample chamber 113, which is a vacuum chamber, to the atmosphere. A plurality of spare probe cartridges 112 are mounted on the probe exchanger 110 in advance, and the exchange mechanism is automatically controlled, so that it is possible to automate the exchange of probe cartridges when evaluating the electrical characteristics of the semiconductor elements and wiring.

The controller 108 includes a charged particle image acquisition unit 114a, a current and voltage detection unit 114b, a current and voltage image acquisition unit 114c, and a control computer 114d. As the sample 101 is irradiated during scanning of the electron beam from the SEM lens barrel 103 as a charged particle beam, the charged particle image acquisition unit 114a acquires a detection signal by the detector 104 of the secondary charged particles emitted from the sample 101, and generates and acquires a charged particle image of the sample 101 based on the acquired detection signal of the secondary charged particles and a control signal for scanning the electron beam as the charged particle beam. In the present embodiment, since the charged particle beam is the electron beam, the charged particle image acquired in such manner is called an SEM image.

The current and voltage detection unit 114b includes a current and voltage detection circuit, a current and voltage source circuit, and the like, and is electrically connected to each of the probes of the probe cartridge 106 in the sample chamber 113. That is, the current and voltage detection unit 114b acquires a value of the current or voltage detected by each probe of the probe cartridge 106 and supplies the current or a voltage to each probe of the probe cartridge 106 as needed when each probe of the probe cartridge 106 comes into contact with an electrode pad or a wiring formed on the sample 101.

As the sample 101 is irradiated during scanning of the electron beam from the SEM lens barrel 103 as the charged particle beam, the current and voltage image acquisition unit 114c acquires a current or voltage signal obtained from each probe by the current and voltage detection unit 114b, and generates and acquires a current and voltage image of the sample 101 based on the acquired current or voltage signal and the control signal for scanning the charged particle beam.

The control computer 114d includes an input device and a storage device (not shown). The control computer 114d is connected to the sample stage 102, the SEM lens barrel 103, the detector 104, the probe driving mechanism 107, the probe exchanger 110, the charged particle image acquisition unit 114a, the current and voltage detection unit 114b, the current and voltage image acquisition unit 114c, the display device 109, and the like, to control the same collectively. The control computer 114d acquires the SEM image, which is a charged particle image acquired by the charged particle image acquisition unit 114a, the current and voltage image acquired by the current and voltage image acquisition unit 114c, and the data of the current and voltage acquired by the current and voltage detection unit 114b, respectively, and displays the result on the display device 109.

FIG. 2 is a schematic diagram of a probe module 201 according to an embodiment of the present invention. The probe module 201 includes a tungsten probe 120, a probe holder 121 for holding the tungsten probe 120, and a probe driving mechanism 122. The combination of the tungsten probe 120 and the probe holder 121 corresponds to the probe cartridge 106 in FIG. 1. The probe driving mechanism 122 corresponds to the probe driving mechanism 107 in FIG. 1. The tungsten probe 120 is in such a shape that is sharper toward the tip, with the curvature of the tip being on the order of nanometers. In the present embodiment, the material of the tungsten probe 120 is tungsten, although, in addition to using tungsten for the material of the probe itself, a probe coated with tungsten may also be used. For a material of the probe 120, a rhenium-tungsten alloy which is a tungsten-based alloy may also be used. A rhenium tungsten alloy is used for the material of the probe 120, so that high strength may be obtained, and a thinner and long-life probe may be obtained. For a material other than tungsten, another material compatible with the manufacturing process of the sample 101 can be used for the material of the probe itself or for coating of the probe. For example, titanium or platinum may be used for coating of the probe. Here, in order to make the probe compatible with the manufacturing process of the sample 101, for example, a material similar to one of the materials used in the manufacturing process of the semiconductor wafer as the sample 101 is used for manufacturing the probe. Examples of the materials used in the manufacturing process of the semiconductor wafer include copper, titanium, tungsten, platinum, aluminum, and the like. For the manufacturing process of the semiconductor device, as shown in FIG. 35, by adding the step of forming an electrode pad of the TEG in the scribe area of the semiconductor wafer in step S3501 and the step of inspecting using a probe made of the same material as one of the materials used in the manufacturing process of the semiconductor wafer in the subsequent step S3502, the probe may be made compatible with the manufacturing process of the sample 101. The material of the tip of the probe and the electrode pad of the sample 101 to which the tip of the probe is brought into contact may be made of the same material, so that, when the tip of the probe is brought into contact for inspection, the affinity between the tip of the probe and the material exposed on the surface of the sample 101, which are of the same type of material, can be further increased. For example, the material of the tip of the probe and the material of the electrode pad of the sample 101 may be tungsten. Thereby, the contamination of the surface of the sample 101 due to the contact with the probe may be further prevented. It is desirable that the exterior of the probe holder 121 and the probe driving mechanism 107 be made conductive by using a conductive material to not be charged even when hit with the charged particles originating from the electron microscope.

FIG. 3 shows a schematic view showing a semiconductor wafer 130 which is an example of the sample 101. The semiconductor wafer 130 includes a pattern 131 corresponding to a chip including a transistor, a circuit, and the like, and a scribe area 132 that is a gap between the patterns. The TEG for inspection purpose, which is to check whether or not the chip has a defect, is arranged in the scribe area 132.

FIG. 4(a) shows an example of a field effect transistor (hereinafter, referred to as an FET)-TEG that is arranged on the scribe area 132. In the case of the FET-TEG, an electrode pad 141 for a substrate, an electrode pad 142 for a gate, an electrode pad 143 for a drain, and an electrode pad 144 for a source are arranged around the FET 140. For the circuit pattern 145 from the FET 140 to each electrode pad, a material having high electric conductivity such as gold or copper is used. The width of the scribe area 132 is about 100 µm, and each electrode pad of the TEG is arranged within a width equal to or less than the width of the scribe area 132.

FIG. 4(b) shows a plurality of minute FET-TEGs arranged on the scribe area 132, which are smaller compared to that of FIG. 4(a). The minute FET-TEG has minute electrode pads arranged on a flat surface. Since these are much smaller than the electrodes of FIG. 4(a), they may be arranged in large numbers on the scribe area 132. While the size of each of the electrode pads 141 to 144 may be reduced to several to several tens of nanometers, which is about the same as the tip of the tungsten probe 120, it is desirable that the size be determined in consideration of contact resistance and contact position accuracy.

FIG. 5 is a view showing an example of performing evaluation of the electrical characteristics of the TEG in the scribe area 132 using the probe module 201 of FIG. 2. The probe modules 201 are mounted on a probe module support base 150 in a fan shape, and are arranged so that the tips of the tungsten probes 106 are close to each other. The probe modules 201 are mounted on the probe module support base 150 in a fan shape so that the four tungsten probes 120 may be arranged in a fan shape and the tips of the four tungsten probes 120 may be brought close to each other, thereby enabling the arrangement of the electrode pads of TEG at a high density. The probe module support 150 is mounted on a rail 151. Basically, the relative position of the tip of each tungsten probe 120 to the measurement position is moved by moving the sample 101 by the sample stage 102. This is to prevent dust generated from the driving part from falling on the semiconductor wafer that serves as the sample 101, but it is also possible to install a dust receiver between the semiconductor wafer serving as the sample 101 and the probe module support 150, to move the probe module support 150 while preventing dust.

Figure 6C:
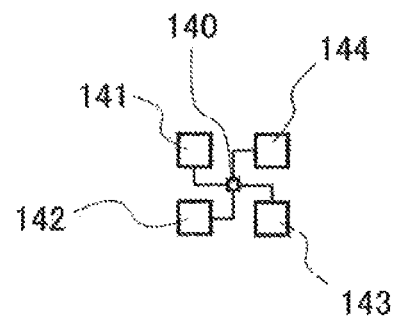
FIG. 6C is a view showing a modification of the arrangement of electrode pads of the FET-TEG in the scribe area.

FIG. 6(a) is a view showing an example of the arrangement of electrode pads of the TEG corresponding to the fan-shaped probe module arrangement shown in FIG. 5. Since the TEG substrate electrode pad 141, the gate electrode pad 142, the drain electrode pad 143, and the source electrode pad 144 are arranged in a U-shape, the arrangement of electrode pads of the TEG shown in FIG. 6(a) is suitable for measurement in which the tips of the tungsten probes 120 of the probe modules arranged in the fan shape shown in FIG. 5 are arranged closely in the fan shape as shown in FIG. 6(a). As a result, the tips of the tungsten probes 120 may be brought close to each other, and the electrode pads of the TEG may be arranged at a high density. The contact between the tips of each tungsten probe 120 and the corresponding electrode pad can be detected by detecting a bend due to the contact of each tungsten probe 120 with the corresponding electrode pad by SEM observation using the SEM lens barrel 103 and the detector 104. FIGS. 6B and 6C show modifications of the arrangement of the electrode pads shown in FIG. 6(a), respectively.

Second Embodiment

In the present embodiment, an embodiment of using a probe manufactured by a micro electro mechanical systems (MEMS) technology (hereinafter, referred to as a MEMS probe), instead of the tungsten probe 120 described in the first embodiment, will be described.

Figure 7A:
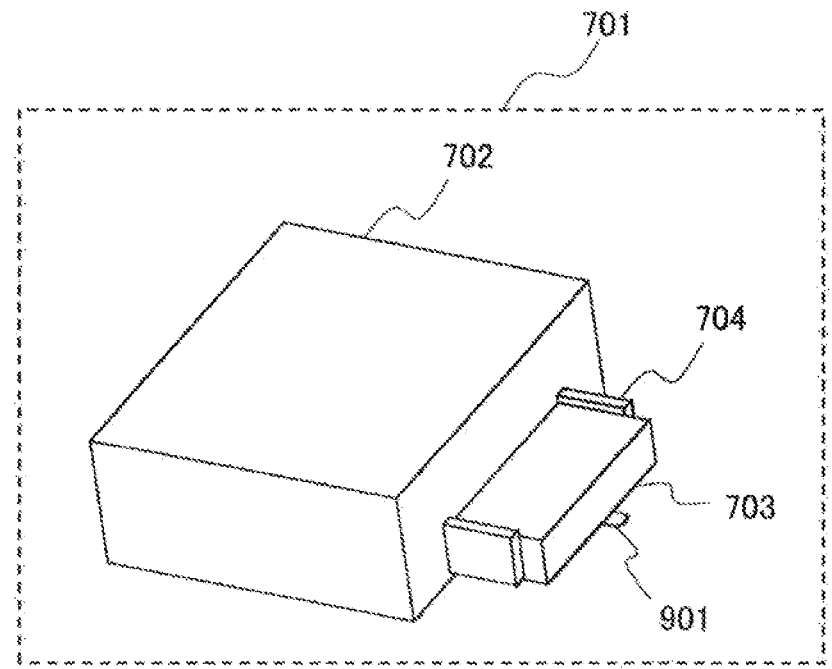
FIG. 7A is a perspective view schematically showing a probe module equipped with a MEMS probe according to an embodiment of the present invention.
Figure 7B:
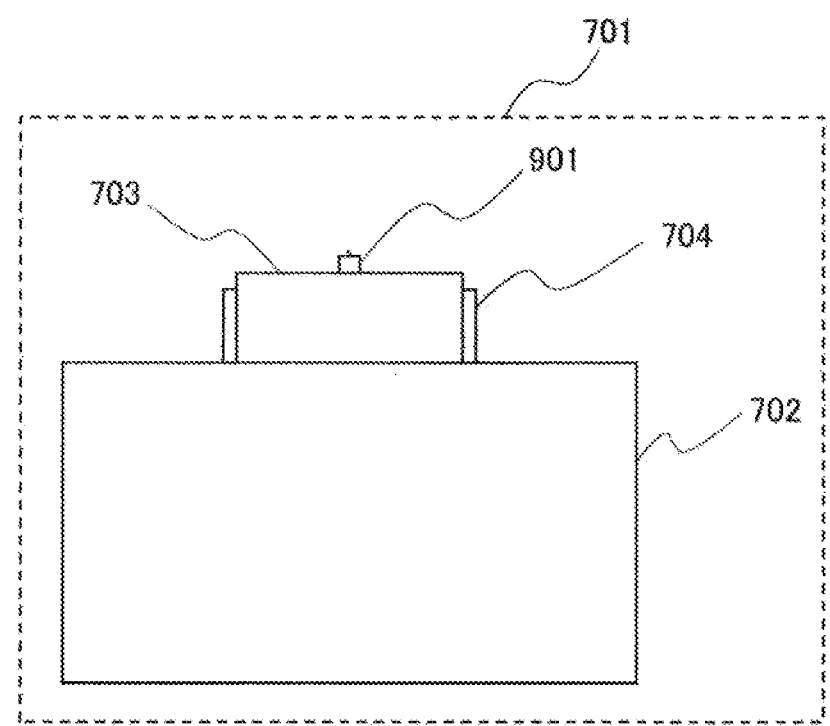
FIG. 7B is a schematic plan view of a probe module equipped with a MEMS probe according to an embodiment of the present invention.

FIGS. 7A and 7B are views showing a probe module 701 according to the present embodiment. FIG. 7(a) is a perspective view of the probe module 701, and FIG. 7(b) is a plan view of the probe module 701 on a side opposite to a side facing the sample 101.

As shown in FIGS. 7A and 7B, the probe module 701 includes a probe driving mechanism 702, a MEMS probe 901 described below, and a probe holder 703 holding the MEMS probe 901. The MEMS probe 901 and the probe holder 703 correspond to the probe cartridge 106 in FIG. 1, and the probe driving mechanism 702 corresponds to the probe driving mechanism 107 in FIG. 1.

The probe driving mechanism 702 includes a cartridge holder 704 for mounting the probe cartridge. The probe driving mechanism 702 includes electrodes for electrically connecting to the probe cartridge, and may easily be electrically connected when the probe cartridge is replaced.

Figure 8A:
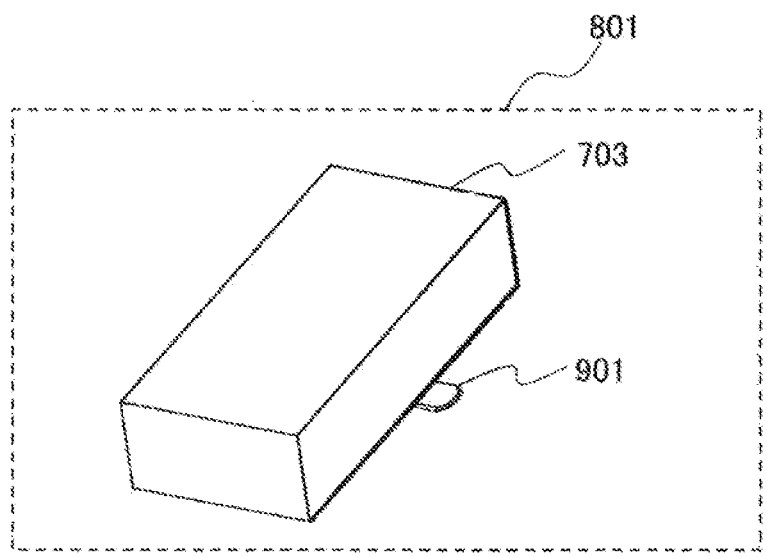
FIG. 8A is a perspective view of a probe cartridge on a side opposite to a side facing a sample according to an embodiment of the present invention.
Figure 8B:
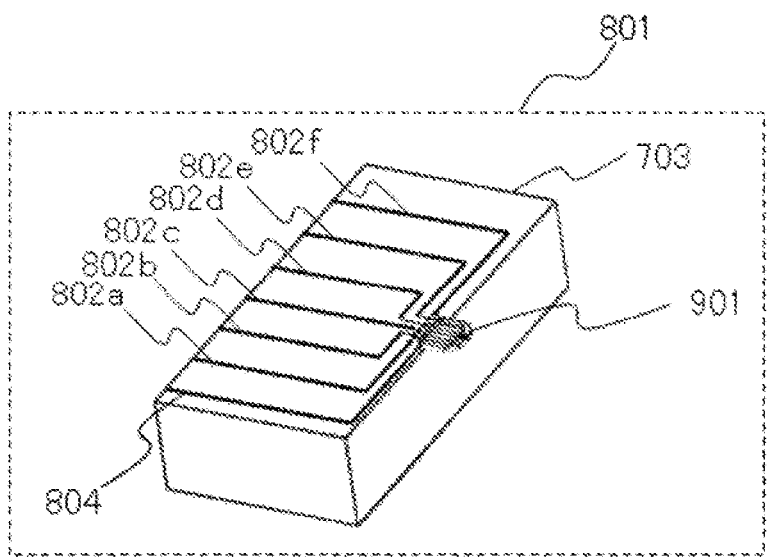
FIG. 8B is a perspective view of the probe cartridge on the side facing the sample according to an embodiment of the present invention.

FIGS. 8A, 8B, and 8C are schematic views showing the probe cartridge 801 according to the present embodiment. FIG. 8(a) is a perspective view of the probe cartridge 801 on a side opposite to the side facing the sample 101. FIG. 8(b) and FIG. 8(c) are perspective views of the probe cartridge 801 on the side facing the sample 101.

As described above, the probe cartridge 801 includes the MEMS probe 901 and the probe holder 703 for holding the MEMS probe 901. The probe holder 703 is electrically connected to the MEMS probe 901 and includes a wiring pattern on a surface on the sample side. For electrical connection between each probe of the MEMS probe 901 and the corresponding wiring of the holder 703, wire bonding may be used, for example. The wirings 802a, 802b, 802c, 802d, 802e, and 802f shown in FIGS. 8B and 8C are electrically connected to the corresponding MEMS probes 901, respectively. The wirings 802a, 802b, 802c, 802d, 802e, and 802f are connected to the electrodes 803a, 803b, 803c, 803d, 803e, and 803f, respectively. In the present embodiment, while there are four probes as the probes for the evaluation of the transistors, six wirings are prepared, and this will be described below.

The probe holder 703 includes a wiring 804 and an electrode 805 connected to the wiring 804. The wiring 804 is connected to a conductor layer provided on a side opposite to a side of the MEMS probe 901 that faces the sample, and this will be described below. Thus, charge-up of the MEMS probe 901 during SEM observation may be prevented. The wiring 804 and the MEMS probe 901 may be electrically connected when joining the MEMS probe 901 and the holder 703 by soldering, for example.

As described above, since the probe cartridge 801 includes the electrodes 803a to 803f and the electrode 805 that are electrically connected when mounted on the probe driving mechanism 107, when a defect such as wear or breakage occurs in the probe during the evaluation of the electrical characteristics, it is possible to replace the probe with a new probe with ease by replacing the probe cartridge 801.

Hereinafter, the MEMS probe 901 will be described. FIG. 9 is an overall perspective view of a probe according to the present embodiment, that is, of the MEMS probe 901. FIG. 9 is illustrated with the probe side facing upward for clarity. As shown in FIG. 9, the MEMS probe 901 includes a cantilever 902 and a main body 903 that supports the cantilever 902. The main body 903 includes a silicon support substrate 904, a buried oxide film 905, and a silicon on insulator (SOI) substrate having a laminated structure of a silicon layer 906. Electrodes 907a, 907b, 907c, 907d, 907e, and 907f are formed on the silicon layer 906 of the main body 903. The electrodes 907a to 907f are tungsten electrodes, for example. The electrode 907a is connected to the wiring 802a of the probe holder 703, the electrode 907b is connected to the wiring 802b of the probe holder 703, the electrode 907c is connected to the wiring 802c of the probe holder 703, the electrode 907d is connected to the wiring 802d of the probe holder 703, the electrode 907e is connected to the wiring 802e of the probe holder 703, and the electrode 907f is connected to the wiring 802f of the probe holder 703, by wire bonding, for example.

FIG. 10 shows an enlarged view of the cantilever 902. On the cantilever 902, probes 1001a, 1001b, 1001c, and 1001d are formed. A conductor layer 1002 is formed on a surface opposite to the surface of the cantilever 902 and the main body 903 on which the probes 1001a to 1001d are formed. The conductor layer 1002 is a tungsten layer, for example. The conductor layer 1002 is electrically connected to the sample holder 105 and prevents charge-up of the MEMS probe 901 by irradiation of an electron beam from the SEM lens barrel 103.

The probes 1001a to 1001d will be described with reference to FIG. 11, which is a plan view of the MEMS probe 901. The probe 1001a includes electrode surfaces 1101a and 1101b. The electrode surfaces 1101a and 1101b are formed of tungsten, for example. The electrode surface 1101a is electrically connected to the wiring 1102a. The wiring 1102a is electrically connected to the electrode 907a. The electrode surface 1101b is electrically connected to the wiring 1102b. The wiring 1102b is electrically connected to the electrode 907b. The wiring 1102a and the wiring 1102b are formed of tungsten, for example. The electrode surface of the probe 1001b is electrically connected to the wiring 1103. The wiring 1103 is electrically connected to the electrode 907c. The electrode surface of the probe 1001b and the wiring 1103 are formed of tungsten, for example. The electrode surface of the probe 1001c is connected to the wiring 1104. The wiring 1104 is electrically connected to the electrode 907d. The electrode surface of the probe 1001c and the wiring 1104 are formed of tungsten, for example. The probe 1001d includes electrode surfaces 1105a and 1105b. The electrode surfaces 1105a and 1105b are formed of tungsten, for example. The electrode surface 1105a is electrically connected to the wiring 1106a. The wiring 1106a is electrically connected to the electrode 907e. The electrode surface 1105b is electrically connected to the wiring 1106b. The wiring 1106b is electrically connected to the electrode 907f. The wiring 1106a and the wiring 1106b are formed of tungsten, for example. In the present embodiment, tungsten is used as the material of the electrode surfaces of the sample 101 to be brought into contact with the electrode pad, but materials other than tungsten that are compatible with the sample 101 may also be used as the material. In the present embodiment, each electrode surface provided on the probes 1001a to 1001d corresponds to the tip of the tungsten probe 120 according to the first embodiment. Therefore, in the present embodiment, the tips of the probes are the electrode surfaces provided on the probes 1001a to 1001d.

When brought into contact with the electrode pad, the probe 1001a serves as a contact sensor for the electrode pad by detecting a conduction state between the electrode surfaces 1101a and 1101b. When brought into contact with the electrode pad, the probe 1001d serves as a contact sensor for the electrode pad by detecting a conduction state between the electrode surfaces 1105a and 1105b.

Figure 28A:
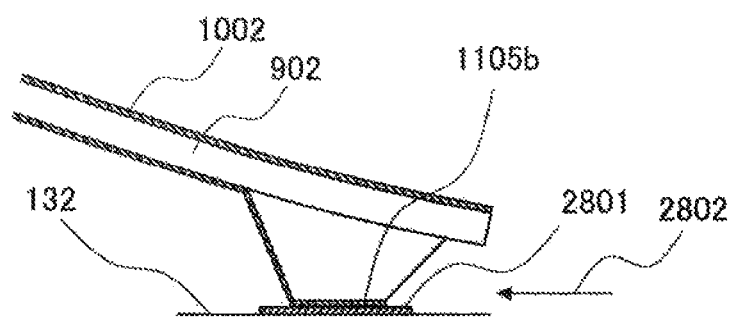
FIG. 28A is a schematic view showing a state in which a probe contacts an electrode pad of a TEG.
Figure 28B:
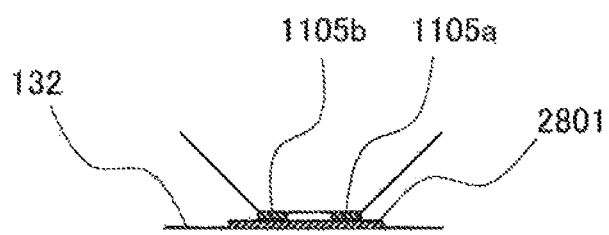
FIG. 28B is a schematic view showing a state in which a probe contacts an electrode pad of a TEG.

FIGS. 28A and 28B are schematic views showing a state in which the probe 1001d is in contact with the electrode pad 2801 of the TEG. FIG. 28(a) is a schematic view showing the state of contact when viewed from the side of the cantilever 902, and FIG. 28(b) is a view showing the state of contact when viewed from the direction of an arrow 2802 in FIG. 28(a). As shown in FIG. 28(a), the electrode surface 1105b of the probe 1001d is parallel to the electrode pad 2801 while being in contact therewith. It may be detected whether the electrode surface 1105a and the electrode surface 1105b are in contact with the electrode pad 2801 by detecting a conduction state therebetween. The contact intensity of the probe with the electrode pad may be ensured by confirming that the contact resistance of each probe is equal to or less than a predetermined value. The probe 1001a and the probe 1001d each serve as a contact sensor, so that the inclination of the surface of the sample 101 may be adjusted by the sample stage 102 to have the probe rows of the probes 1001a to 1001d parallel with the wafer surface to be inspected, and the stable inspection may be performed.

FIG. 12 is a cross-sectional view of the MEMS probe 901 taken along a broken line between A-A' in FIG. 11. As described above, the main body 903 includes the silicon support substrate 904, the buried oxide film 905, and the SOI substrate of the silicon layer 906. The thickness of the main body 903 is adjusted mainly by the thickness of the silicon support substrate 904. As described above, the conductor layer 1002 is on a surface opposite to the surface of the cantilever 902 and the main body 903 on which the probes 1001a to 1001d are formed. The electrode surface of the probe 1001b is inclined with respect to the cantilever 902 such that the electrode surface of the probe 1001b is parallel to the electrode pad while being in contact therewith. The electrode surfaces of the probes 1001a, 1001c and 1001d are also inclined with respect to the cantilever 902 in the same manner as the probe 1001b. The probe 1001b is electrically connected to the wiring 1103.

A method for manufacturing the MEMS probe 901 according to the present embodiment will be described with reference to FIGS. 13 and 14A to 14M. FIG. 13 is a flowchart showing a process of manufacturing the MEMS probe 901. FIGS. 14A to 14M are cross-sectional views taken along a broken line between A-A' in FIG. 11 and are views showing a process of manufacturing the MEMS probe 901.

Figure 14A:
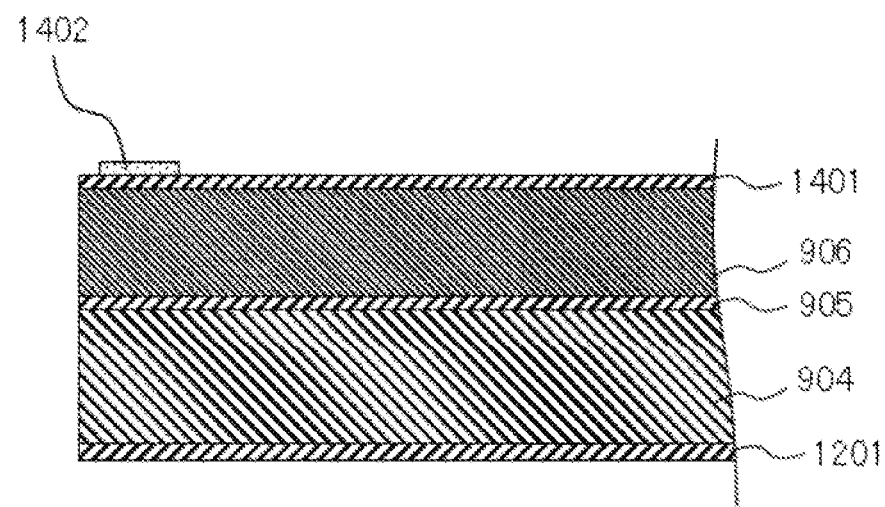
FIG. 14A is a view provided to explain a process of manufacturing the MEMS probe according to an embodiment of the present invention.
Figure 14B:
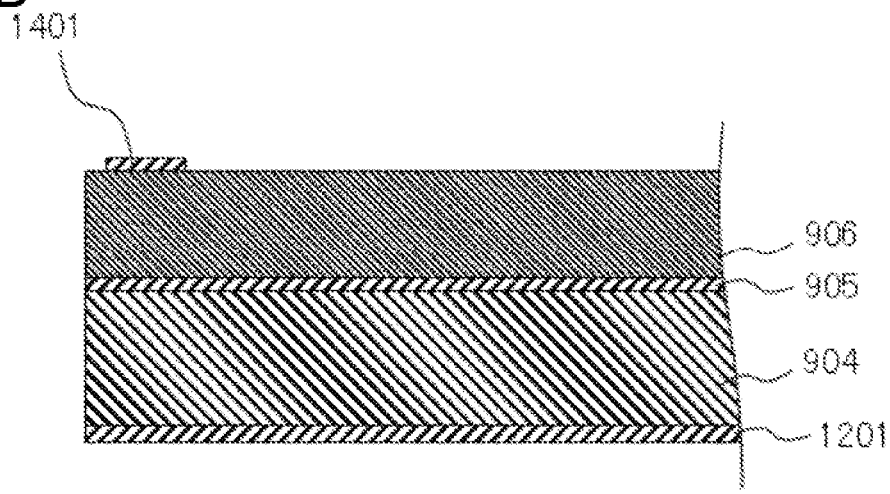
FIG. 14B is a view provided to explain a process of manufacturing the MEMS probe according to an embodiment of the present invention.

In step S1301 of FIG. 13, as shown in FIG. 14(a), a silicon oxide film 1201 and a silicon oxide film 1401 are provided, by thermal oxidation, on both surfaces of the SOI substrate having the silicon support substrate 904, the buried oxide film 905, and the silicon layer 906, and a photoresist film 1402 is further provided on the silicon oxide film 1401. Next, in step S1302, as shown in FIG. 14(b), the silicon oxide film 1401 is patterned using the photoresist film 1402 as a mask.

Figure 14C:
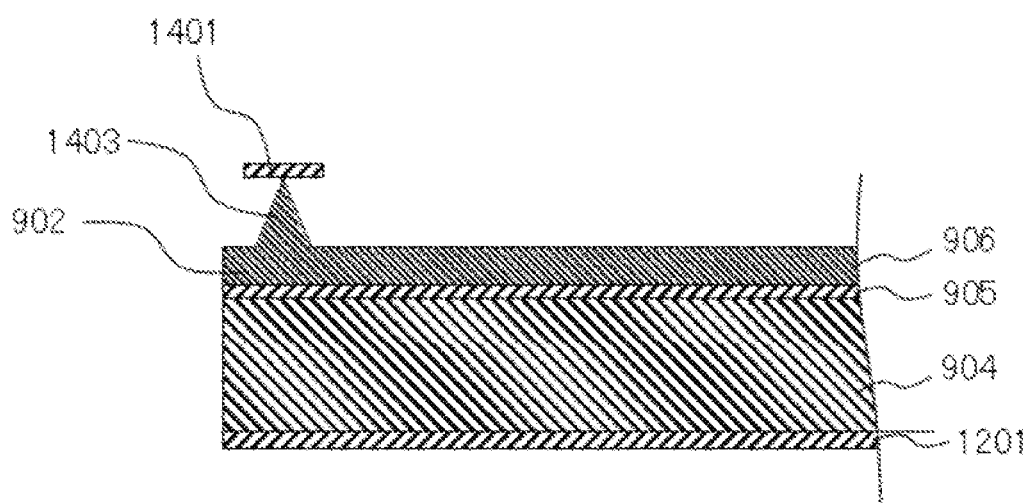
FIG. 14C is a view provided to explain a process of manufacturing the MEMS probe according to an embodiment of the present invention.
Figure 14D:
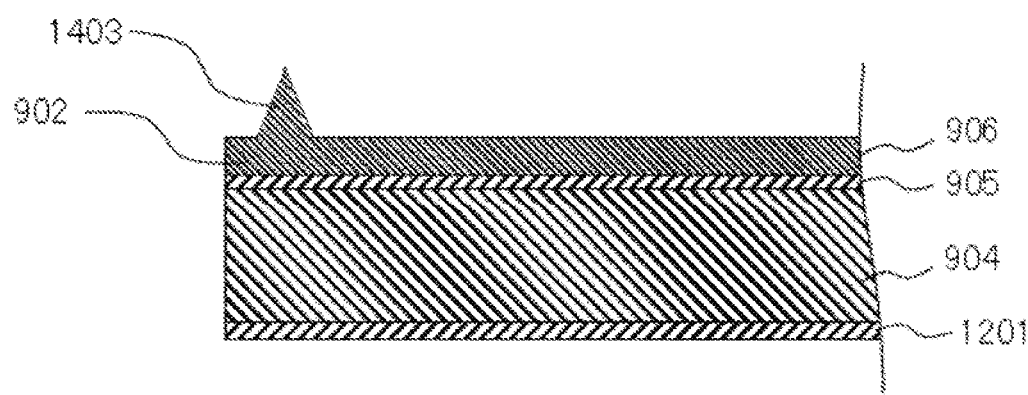
FIG. 14D is a view provided to explain a process of manufacturing the MEMS probe according to an embodiment of the present invention.

Next, in step S1303, using the silicon oxide film 1401 patterned in S1302 as a mask, the silicon layer 906 is etched by reactive ion etching or wet etching, so that a protrusion 1403 is formed as shown in FIG. 14(c). FIG. 14(c) shows the protrusion 1403 that corresponds to the probe 1001b. The protrusions corresponding to each of the probes 1001a, 1001c, and 1001d are also formed in step S1303, in the same manner as the protrusion 1403. Next, in step S1304, as shown in FIG. 14(d), the silicon oxide film 1401 patterned in S1302 is removed using buffered hydrofluoric acid (BHF).

Figure 14E:
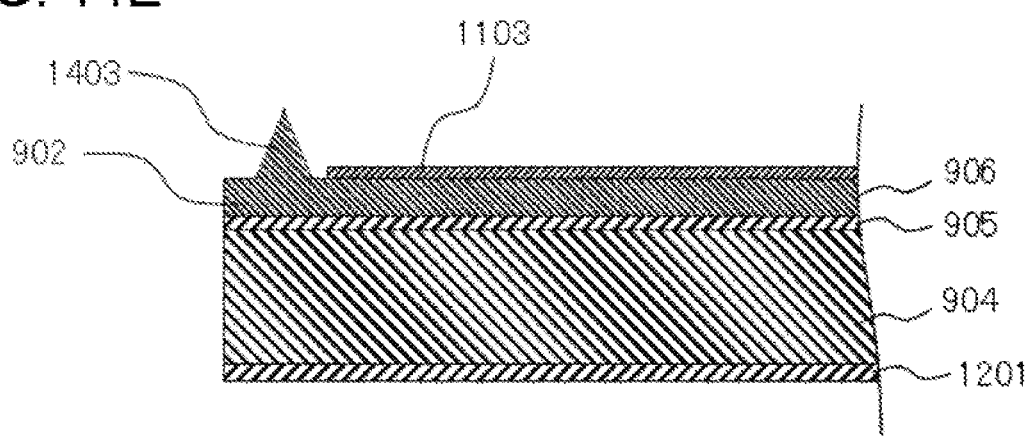
FIG. 14E is a view provided to explain a process of manufacturing the MEMS probe according to an embodiment of the present invention.

Next, in step S1305, the wiring 1103 is formed as shown in FIG. 14(e). Specifically, the wiring 1103 is formed by patterning the tungsten layer with a photoresist. In step S1305, the wirings 1102a, 1102b, 1104, 1106a and 1106b, and the electrodes 907a to 907f are also formed in the same manner as the wiring 1103. Next, in step S1306, patterning of the cantilever 902 is performed. The patterning of the cantilever 902 is performed by photolithography, for example.

Figure 14F:
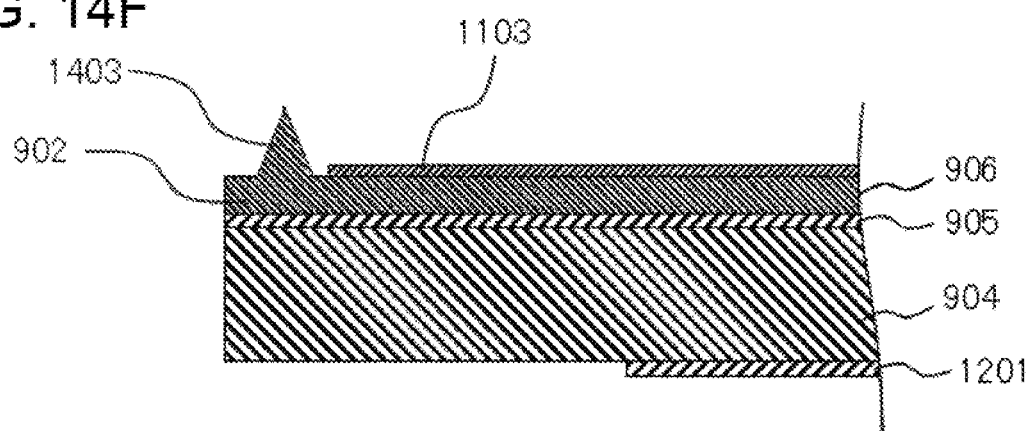
FIG. 14F is a view provided to explain a process of manufacturing the MEMS probe according to an embodiment of the present invention.
Figure 14G:
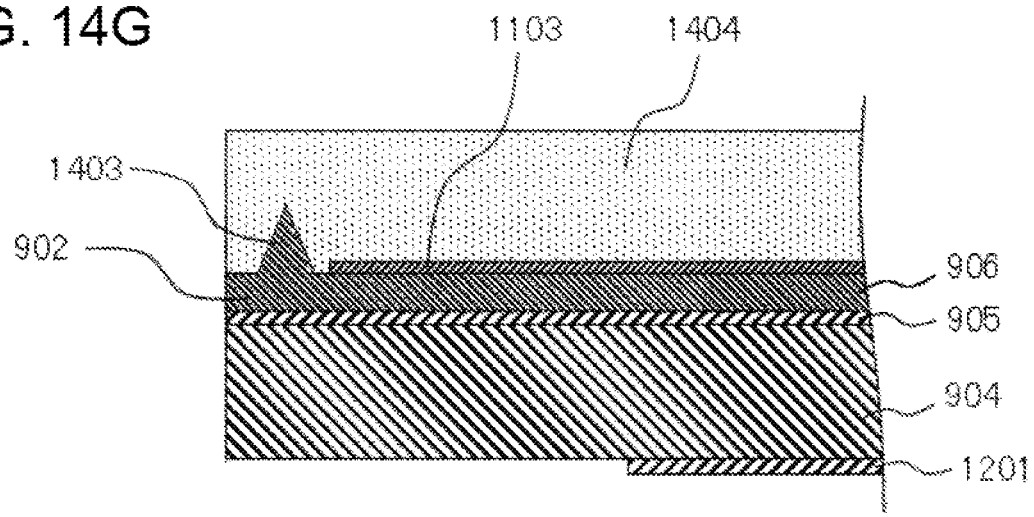
FIG. 14G is a view provided to explain a process of manufacturing the MEMS probe according to an embodiment of the present invention.

Next, in step S1307, the silicon oxide film 1201 is etched to form a mask for forming the main body 903, as shown in FIG. 14(f). Next, in step S1308, in order to protect the cantilever 902, a photoresist film 1404 is formed on the cantilever 902 side as shown in FIG. 14(g).

Figure 14H:
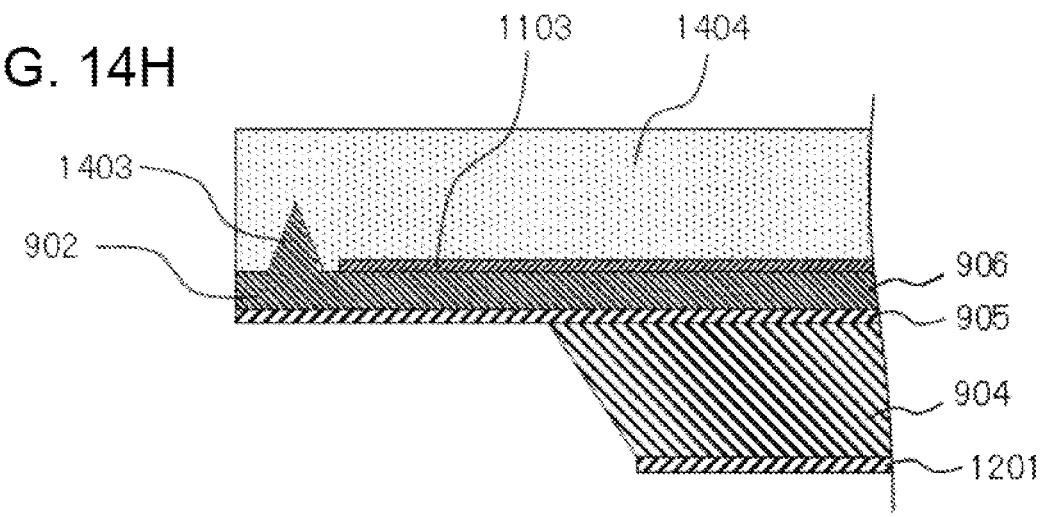
FIG. 14H is a view provided to explain a process of manufacturing the MEMS probe according to an embodiment of the present invention.
Figure 14I:
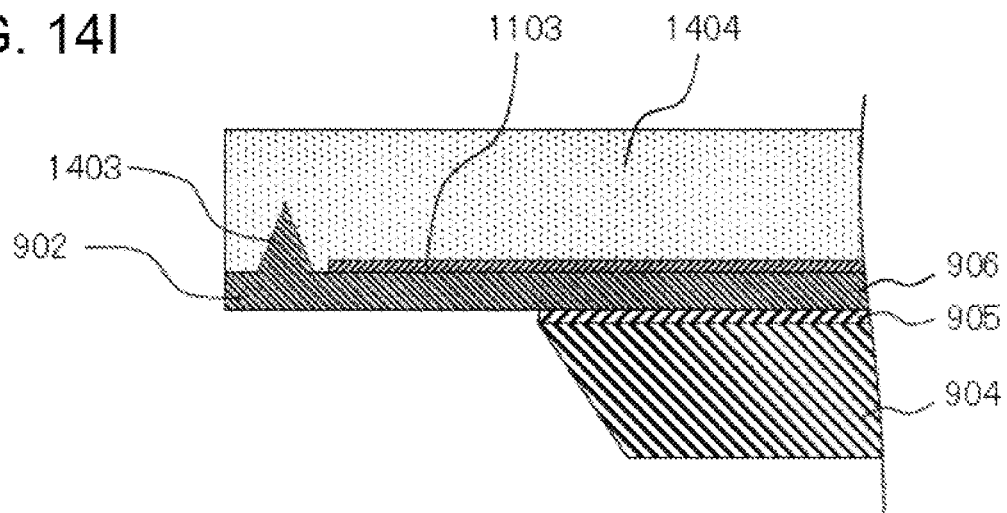
FIG. 14I is a view provided to explain a process of manufacturing the MEMS probe according to an embodiment of the present invention.

Next, in step S1309, the main body 903 is formed by etching the silicon support substrate 904 by wet etching using the mask formed in step S1307, as shown in FIG. 14(h). Next, in step S1310, the buried oxide film 905 excluding the main body 903 and the silicon oxide film 1201 are removed by etching with buffered hydrofluoric acid (BHF), as shown in FIG. 14(i).

Figure 14J:
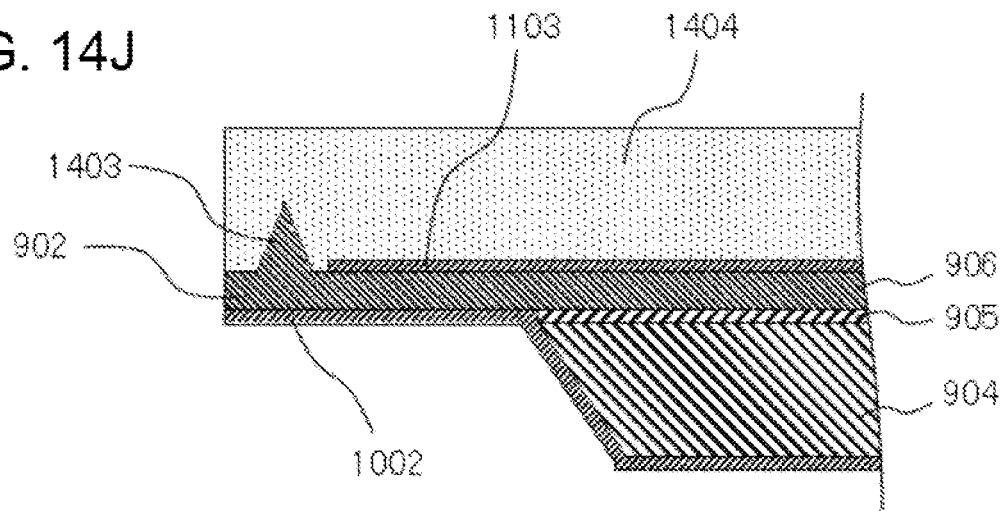
FIG. 14J is a view provided to explain a process of manufacturing the MEMS probe according to an embodiment of the present invention.
Figure 14K:
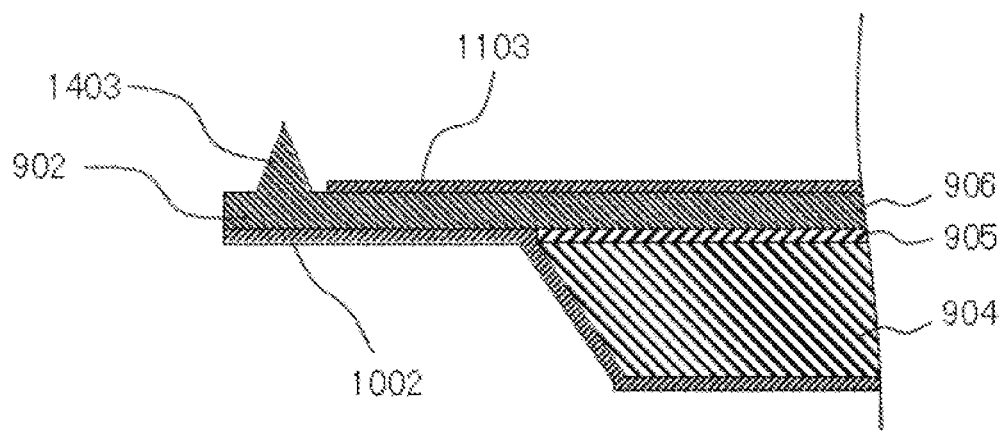
FIG. 14K is a view provided to explain a process of manufacturing the MEMS probe according to an embodiment of the present invention.

Next, in step S1311, as shown in FIG. 14(j), the conductor layer 1002 is formed on a surface opposite to the surface of the cantilever 902 and the main body 903 on which the probes 1001a to 1001d are formed. Next, in step S1312, as shown in FIG. 14(k), the photoresist film 1404 formed in step S1308 is removed.

Figure 14L:
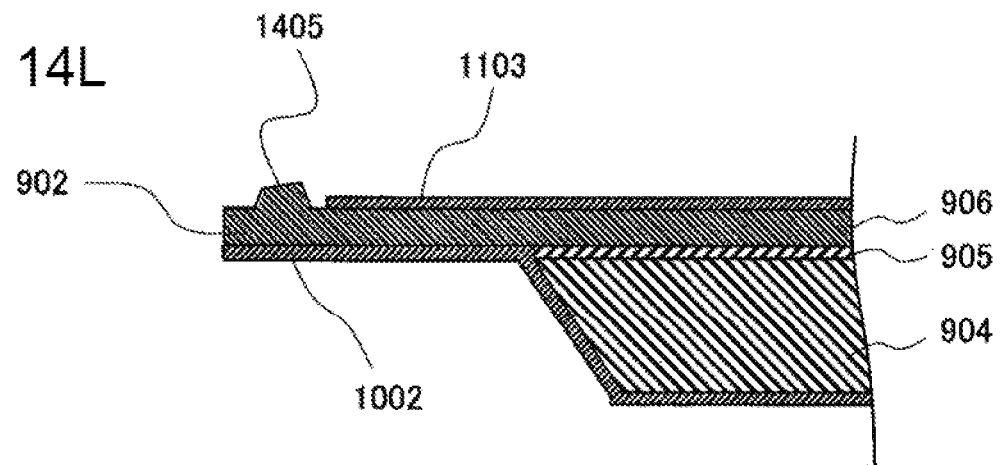
FIG. 14L is a view provided to explain a process of manufacturing the MEMS probe according to an embodiment of the present invention.

Next, in step S1313, a portion of the protrusion 1403 is cut off by the focused ion beam (FIB), so that a surface 1405 inclined to the cantilever 902 is provided on the projection 1404 as shown in FIG. 14(l). The protrusions corresponding to each of the probes 1001a, 1001c, and 1001d are also partially cut off in step S1313 in the same manner as the protrusion 1403. Next, in step S1314, tungsten is deposited by chemical vapor deposition using focused ion beam (FIB-CVD), so that an electrode surface of the probe 1001b electrically connected to the wiring 1103 is formed as shown in FIG. 14(m). Here, as described above, the angle of inclination is set such that the electrode surface of the probe 1001b is parallel to the electrode pad of TEG while being in contact with the electrode pad of the TEG. Also for the probes 1001a, 1001c and 1001d, the respective electrode surfaces shown in FIG. 11 are formed in the same manner as the probe 1001b.

As described above, the MEMS probe 901 according to the present embodiment may be manufactured. In the present embodiment, since the MEMS probe 901 is manufactured by manufacturing the device using the MEMS technology, manufacturing with good reproducibility is possible.

FIG. 15 shows an enlarged view of a cantilever of a MEMS probe according to a modification of the present embodiment. As shown in FIG. 15, the area hidden by the cantilever in SEM observation using the SEM lens barrel 103 and the detector 104 can be reduced by cutting off, with FIB, a portion of the area 1501 of the cantilever 902 that is surrounded by the broken line.

FIG. 16 shows an enlarged view of a cantilever of a MEMS probe according to a modification of the present embodiment. As shown in FIG. 16, with FIB, by cutting off the portion of the area 1601 of the cantilever 902 surrounded by the broken line and making a cut between the probes, it is possible to bring each probe reliably into contact with the electrode pad by bending the cantilever of each probe even when the height of the electrode pad is different. In the MEMS probe of FIG. 16, all of the four probes are provided with the two electrodes, to make it possible to detect the contact of each probe with the electrode pad.

FIG. 17 shows an enlarged view of a cantilever of a MEMS probe according to a modification of the present embodiment. In the MEMS probe shown in FIG. 17, a number of probes is eight so that the inspection of the inverter is facilitated.

FIG. 18 shows an enlarged view of a cantilever of a MEMS probe according to a modification of the present embodiment. In the MEMS probe shown in FIG. 18, a distance between B-B', that is, the interval between two probes is several mm so that the wiring inspection may be facilitated. The evaluation of the wiring pattern may be performed by drawing an absorption current image (including an absorption voltage image) based on the absorption current flowing into the probe when an electron beam, which is a charged particle beam, is irradiated onto the wiring from the SEM lens barrel 103 with the probe in contact with one end of the wiring. Therefore, the distance between the probes is required to be several mm at the maximum. It is possible to cope with wiring patterns of various widths by manufacturing the MEMS probe by changing the distance between the probes.

FIG. 19 shows an enlarged view of a cantilever of a MEMS probe according to a modification of the present embodiment. In the MEMS probe shown in FIG. 19, the probes 1004a to 1004d are formed on a common protrusion. Thus, the intervals between the probes 1004a to 1004d may be easily narrowed, and inspection may be performed even when the pitch of the arrangement of the electrode pads is short. The intervals between the probes 1004a to 1004d may be about several hundred nm to several tens of microns, for example.

FIG. 20 shows an enlarged view of a cantilever of a MEMS probe according to a modification of the present embodiment. FIG. 21 shows a cross-sectional view of the MEMS probe, along the cross section through the probe 1001c and the wiring connected to the probe 1001c in FIG. 20. In the MEMS probe shown in FIGS. 20 and 21, an area 2001 ion-implanted with boron is provided in the silicon layer 906 of the cantilever 902 to form a piezoresistive element, so that the bending of the cantilever 902 caused by contact with the sample may be detected. Therefore, contact of the probe with the sample may be detected by a change in the resistance of the piezoresistive element. At this time, vibration may be applied to the cantilever 902, so that contact may be detected by a change in the resonance frequency due to the contact.

With the provision of the area 2001 ion-implanted with boron, an insulator layer 2002 for insulating the area 2001 ion-implanted with boron and the wiring connected to the probe 1001c, and an insulator layer 2003 for insulating the ion-implanted area 2001 and the conductor layer 1002 are additionally provided. The insulator layers 2002 and 2003 may be formed using a silicon oxide film formed by sputter-deposition, for example. In order to read the change in the resistance of the piezoresistive element, openings 2004a and 2004b are provided in the insulator layer 2002, and the wirings 2005a and 2005b are connected to the area 2001 ion-implanted with boron as shown in FIG. 20. In the manufacturing method, after step S1304 shown in FIG. 13, a process of forming the area 2001 ion-implanted with boron is added, and subsequently, a process of forming the insulator layer 2002 provided with the openings 2004a and 2004b is added. After step S1310, a process of providing the insulator layer 2003 is added.

When the contact sensor is realized by the piezoresistive element, the method as shown in FIG. 11, in which one probe is provided with two electrode surfaces and a contact with the pad is detected from a conduction state between the electrode surfaces, may be employed in combination. As a result, it is possible to more reliably detect the contact of the probe with the sample.

Third Embodiment

In the present embodiment, another embodiment of the MEMS probe attached to the probe holder 703 will be described.

FIG. 22 is an overall perspective view of a probe according to the present embodiment, that is, of a MEMS probe 2201. FIG. 22 is illustrated with the probe side facing upward for clarity. As shown in FIG. 22, the MEMS probe 2201 has metal probes 2202a, 2202b, 2202c and 2202d, and a main body 2203 that supports the metal probes 2202a to 2202d.

The main body 2203 includes a silicon substrate 2204 and a silicon oxide film 2205. Electrodes 2206a, 2206b, 2206c and 2206d are formed on the silicon oxide film 2205 of the main body 2203. The electrodes 2206a to 2206d are tungsten electrodes, for example. The electrodes 2206a to 2206d are respectively connected to four of the wirings 802a to 802f of the probe holder 703 by wire bonding, for example.

FIG. 23 is a plan view of an area in the vicinity of the metal probes 2202a to 2202d of the MEMS probe 2201. As shown in FIG. 23, the metal probes 2202a to 2202d are formed such that tips thereof are close to each other. As described above, the metal probes 2202a to 2202d are arranged in a fan shape. The tips of the metal probes 2202a to 2202d are brought into contact with the electrode pads of the TEG. The metal probes 2202a to 2202d are formed of tungsten, for example. In the present embodiment, tungsten is used as the material of the metal probes 2202a to 2202d to be brought into contact with the electrode pads of the sample 101, but materials other than tungsten that are compatible with the sample 101 may also be used as a material.

The metal probe 2202a is electrically connected to the wiring 2301a. The wiring 2301a is electrically connected to the electrode 2206a. The metal probe 2202b is electrically connected to the wiring 2301b. The wiring 2301b is electrically connected to the electrode 2206b. The metal probe 2202c is electrically connected to the wiring 2301c. The wiring 2301c is electrically connected to the electrode 2206c. The metal probe 2202d is electrically connected to the wiring 2301d. The wiring 2301d is electrically connected to the electrode 2206d. The wirings 2301a to 2301d are formed of tungsten, for example.

FIG. 24 is a cross-sectional view of the MEMS probe 2201 taken along a broken line between C-C' in FIG. 23. In the MEMS probe 2201, the silicon oxide film 2205 is formed on the silicon substrate 2204 as described above. Formed on the silicon oxide film 2205 as the insulation layer is the wiring 2301b, and a metal probe 2202b that extends from the wiring 2301b. The wiring 2301a, the metal probe 2202a, the wiring 2301c, the metal probe 2202c, the wiring 2301d, and the metal probe 2202d are formed in the same manner as the wiring 2301b and the metal probe 2202b. A conductor layer 2401 is formed on a surface opposite to the surface of the main body 2203 on which the metal probes 2202a to 2202d are formed. The conductor layer 2401 is a tungsten layer, for example. The conductor layer 2401 is separated from the metal probes 2202a to 2202d to not be electrically connected.

FIG. 25 shows an enlarged view of an encircled portion 2402 indicated by a broken line shown in FIG. 24. As shown in FIG. 25, the silicon oxide film 2205 is at a recessed position from an edge of the silicon substrate 2204. As described below, when the conductor layer 2401 is formed by sputter-deposition or the like, the conductor layer 2401 is separated from the metal probes 2202a to 2202d and the wirings 2301a to 2301d by the recessed structure of the silicon oxide film 2205. The conductor layer 2401 is a tungsten layer, for example. The conductor layer 2401 is electrically connected to the sample holder 105, and prevents charge-up of the MEMS probe 2201 due to irradiation of an electron beam from the SEM lens barrel 103. Although omitted in FIG. 24, as shown in FIG. 25, when the conductor layer 2401 is formed, a conductor layer 2501 is formed on a side of the metal probes 2202a to 2202d opposite to the surface in contact with the electrode pad of the TEG.

A method for manufacturing the MEMS probe 2201 according to the present embodiment will be described with reference to FIGS. 26 and 27A to 27H. FIG. 26 is a flowchart showing a process of manufacturing the MEMS probe 2201. FIGS. 27A to 27H are cross-sectional views taken along a broken line between C-C' in FIG. 23 and are views showing a process of manufacturing the MEMS probe 2201.

Figure 27A:
FIG. 27A is a view provided to explain a process of manufacturing the MEMS probe according to an embodiment of the present invention.

In step S2601 of FIG. 26, as shown in FIG. 27(a), a silicon oxide film 2205 is provided on one surface of a silicon substrate 2204, and a silicon oxide film 2701 is provided on the other surface thereof by thermal oxidation.

Next, in step S2602, the surface of the silicon oxide film 2205 is sputter-etched using argon gas or the like, or impurity ions are ion-implanted into the surface of the silicon oxide film 2205, so that a modified layer is introduced on the surface of the silicon oxide film 2205. Thus, when a metal layer is formed on the silicon oxide film 2205 described below, a high-quality metal layer may be formed, and high-quality metal probes 2202a to 2202d may be obtained.

Figure 27B:
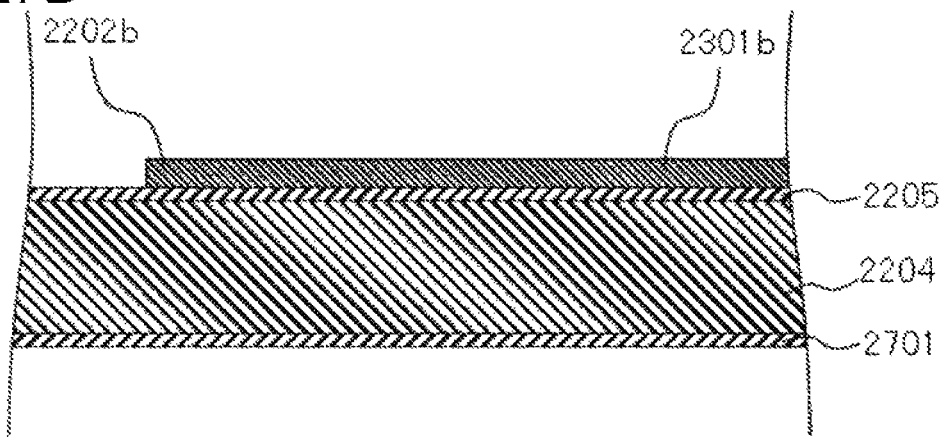
FIG. 27B is a view provided to explain a process of manufacturing the MEMS probe according to an embodiment of the present invention.

Next, in step S2603, a metal layer is formed and patterned on the silicon oxide film 2205 to form metal probes 2202a to 2202d, wirings 2301a to 2301d, and electrodes 2206a to 2206d, as shown in FIG. 27(b). The metal layer may be formed by sputter-deposition of tungsten, for example. At this time, when the modified layer is introduced in step S2602, the surface of the silicon oxide film 2205 is in such a surface state that has the presence of the atomic bonding, where it is expected that the tungsten nuclei having a body-centered cubic structure are formed, followed by the formation of a tungsten layer having a body-centered cubic structure. As a result, large crystal grains of tungsten having the body-centered cubic structure are formed, and the segregation of foreign matter at the grain boundary is reduced, which may result in a high-quality tungsten layer.

Figure 27C:
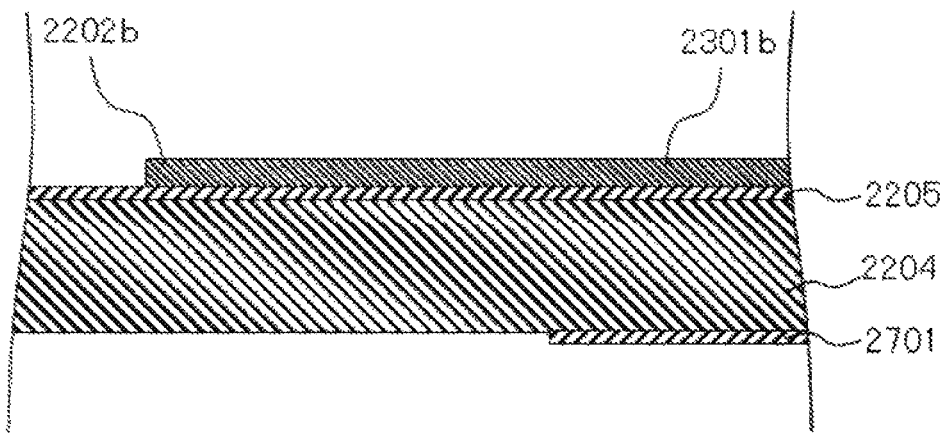
FIG. 27C is a view provided to explain a process of manufacturing the MEMS probe according to an embodiment of the present invention.
Figure 27D:
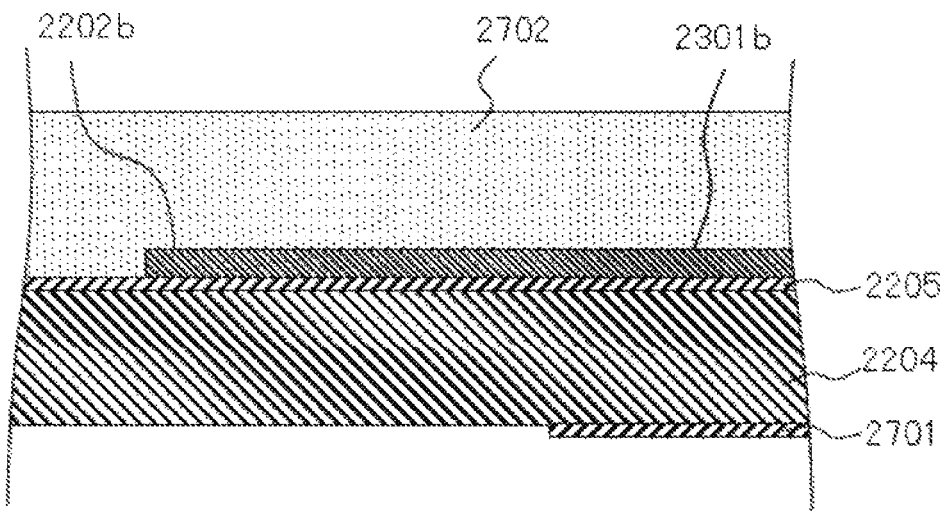
FIG. 27D is a view provided to explain a process of manufacturing the MEMS probe according to an embodiment of the present invention.
Figure 27E:
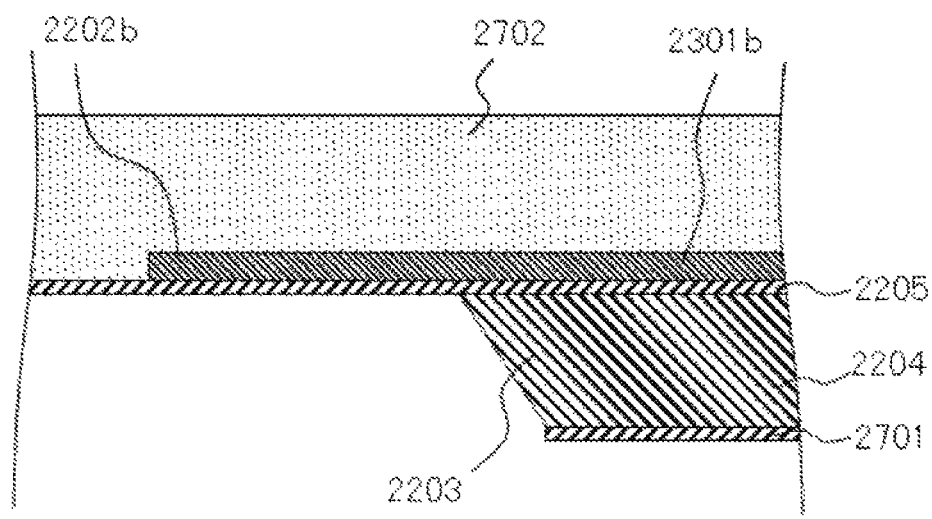
FIG. 27E is a view provided to explain a process of manufacturing the MEMS probe according to an embodiment of the present invention.

Next, in step S2604, the silicon oxide film 2701 is etched to form a mask for forming the main body 2203, as shown in FIG. 27(c). Next, in step S2605, as shown in FIG. 27(d), a photoresist film 2702 is formed on the metal probes 2202a to 2202d to protect the metal probes 2202a to 2202d. Next, in step S2606, the main body 2203 is formed by etching the silicon substrate 2204 by wet etching using the mask formed in step S2604, as shown in FIG. 27(e).

Figure 27F:
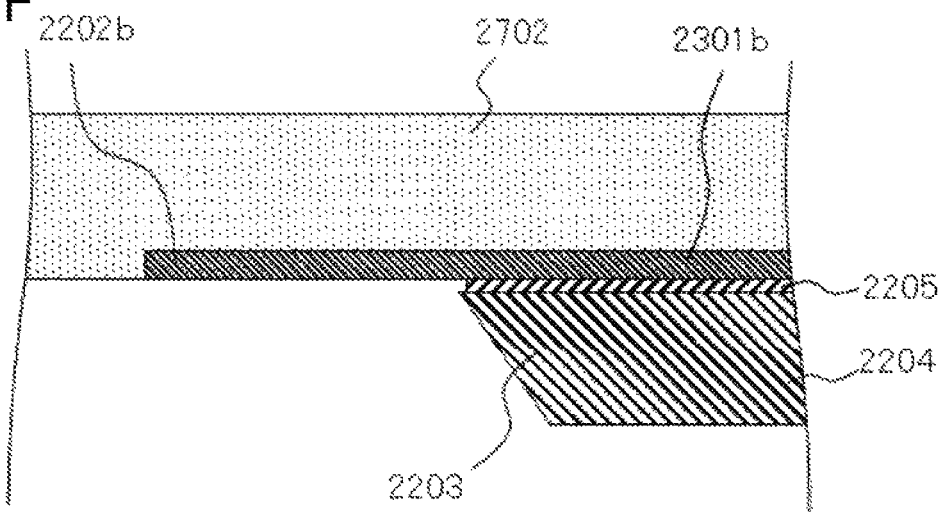
FIG. 27F is a view provided to explain a process of manufacturing the MEMS probe according to an embodiment of the present invention.

Next, in step S2607, as shown in FIG. 27(f), the silicon oxide film 2205 except for contact portions with the main body 2203 and the silicon oxide film 2701 are etched and removed using buffered hydrofluoric acid (BHF). At the time of etching the silicon oxide film 2205 in step S2607, as shown in FIG. 25, the etching is performed such that the silicon oxide film 2205 is formed at a position recessed from the edge of the silicon substrate 2204.

Figure 27G:
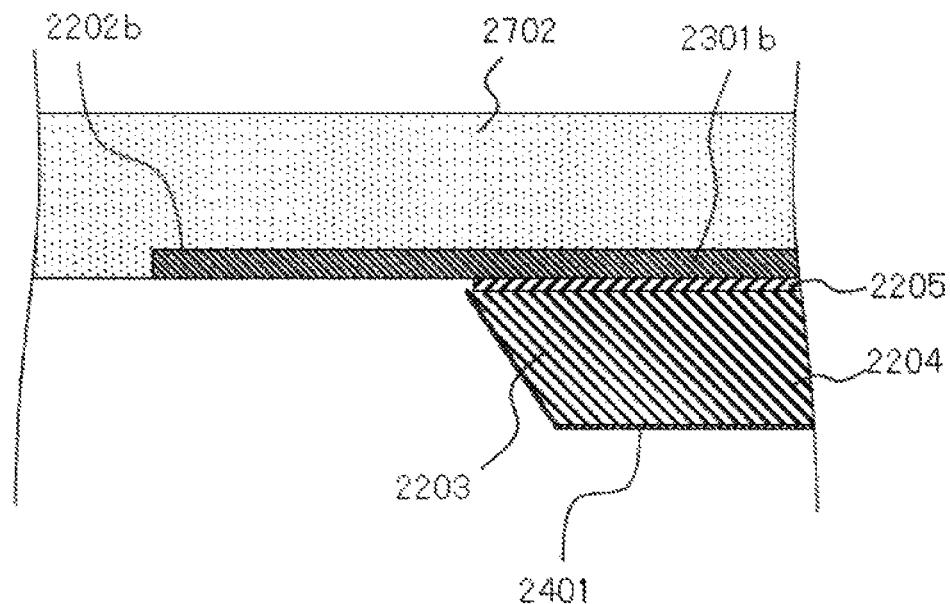
FIG. 27G is a view provided to explain a process of manufacturing the MEMS probe according to an embodiment of the present invention.
Figure 27H:
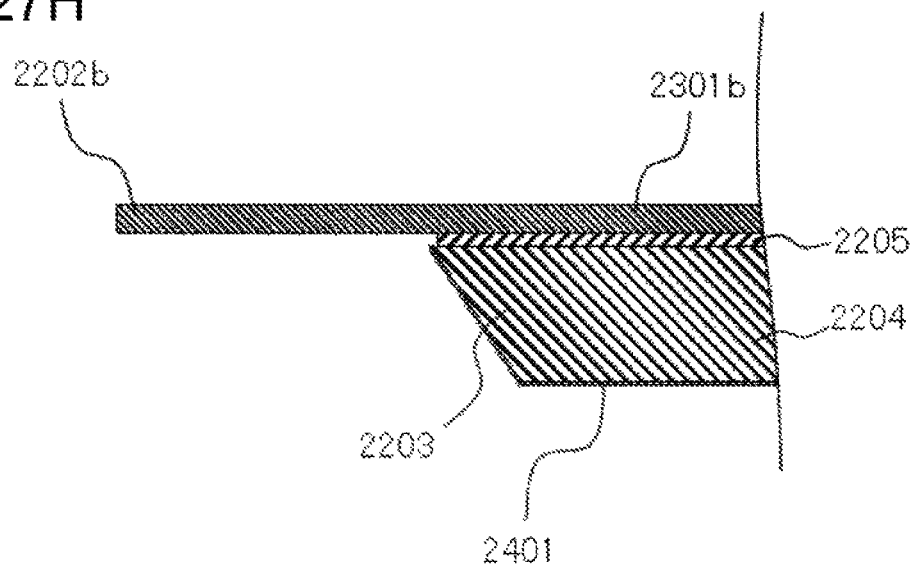
FIG. 27H is a view provided to explain a process of manufacturing the MEMS probe according to an embodiment of the present invention.

Next, in step S2608, as shown in FIG. 27(g), the conductor layer 2401 is formed on the surface opposite to the surface on which the metal probes 2202a to 2202d are formed. The conductor layer 2401 may be formed by sputter-deposition of tungsten, for example. The thickness of the conductor layer 2401 is smaller than the thickness of the silicon oxide film 2205. When the conductor layer 2401 is formed by sputter-deposition or the like, the silicon oxide film 2205 is not deposited on the portion recessed from the edge of the silicon substrate 2204, so that the conductor layer 2401 is electrically separated from the metal probes 2202a to 2202d and the wirings 2301a to 2301d. Next, in step S2609, as shown in FIG. 27(h), the photoresist film 2702 formed in step S2605 is removed.

As described above, the MEMS probe 2201 according to the present embodiment may be manufactured. In the present embodiment, since the MEMS probe 2201 is manufactured by manufacturing the device using the MEMS technology, manufacturing with good reproducibility is possible.

Fourth Embodiment

In the present embodiment, an example of a layout of the FET-TEG corresponding to an array of the probes according to the first to third embodiments will be described with reference to FIGS. 29A and 29B.

Figure 29A:
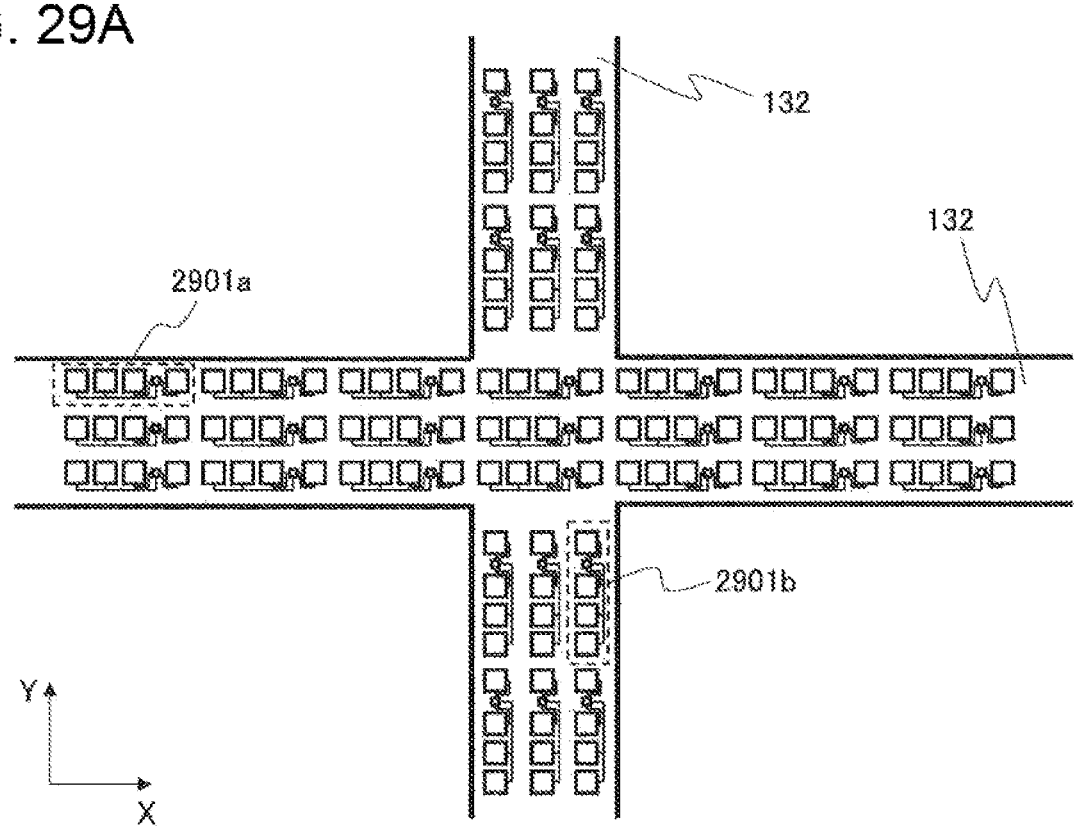
FIG. 29A is a view showing an example of the FET-TEG arrangement in a scribe area.

In the example of the layout of the FET-TEG shown in FIG. 29(a), the electrode pads of the FET-TEG are arranged in a direction along each of the scribe areas 132 including the scribe area 132 in an X direction extending in the horizontal direction and the scribe area 132 in a Y direction extending in the vertical direction. For example, an electrode pad group 2901a of the FET-TEG in the scribe area 132 in the X direction and an electrode pad group 2901b of the FET-TEG in the scribe area 132 in the Y direction are laid out in directions orthogonal to each other.

In FIG. 29(b), the electrode pads of the FET-TEG are all arranged along the scribe area 132 in the X direction extending in the horizontal direction. For example, the electrode pad group 2901c of the FET-TEG in the scribe area 132 in the X direction and the electrode pad group 2901d of the FET-TEG in the scribe area 132 in the Y direction extending in the vertical direction are laid out in the same direction. Note that, in FIG. 29(b), although one FET-TEG is arranged along the width of the scribe area in the Y direction, a plurality of FET-TEGs may be arranged along the width of the scribe area in the Y direction when finer electrode pads are used. Since all the electrode pads of the FET-TEG shown in FIG. 29(b) are arranged in the same direction, the FET-TEG of the scribe areas 132 in the X and Y directions may be continuously evaluated without changing the direction of the probe cartridge 106 with respect to the sample 101. As a result, the semiconductor device may be manufactured efficiently.

Fifth Embodiment

In the present embodiment, an example of inspection of each probe of the probe cartridge 106 according to the first to third embodiments will be described. FIG. 30 shows a schematic view of electrode pads 3001 for checking the normality of each probe of the probe cartridge 106. The electrode pads 3001 for checking the normality of the probe are arranged in the scribe area 132 and arranged according to the position of the tip of each probe. The electrode pads 3001 is electrically connected by a wiring 3002. The normality of each probe of the probe cartridge 106 is realized by measuring a current value flowing through another probe when a voltage is applied to any one of the probes in a state in which each probe is brought into contact with each electrode pad 3001. Confirming the normality of the probe according to the present embodiment is to confirm whether there is any abnormality of each probe or mounting failure of the probe cartridge 106 prior to the evaluation of the electrical characteristics of the TEG.

Sixth Embodiment

In the present embodiment, an example of a flow of electrical characteristic evaluation using the probe cartridges 106 according to the first to third embodiments will be described. FIG. 31 shows an example of a flowchart of the electrical characteristic evaluation using the probe cartridge 106.

Hereinafter, the evaluation procedure will be described. First, in step S3101, the probe exchanger 110 attaches the probe cartridge 106 to the probe driving mechanism 107 or replaces the probe cartridge 106. The attachment or replacement of the probe cartridge 106 is performed with the probe driving mechanism 107 moved to the probe cartridge replacement position.

Next, in step S3102, it is checked whether the probe cartridge 106 is properly attached, and it is determined whether the probe cartridge 106 may be measured. The determination as to whether the probe cartridge 106 is normally attached is performed by a sensor for confirming contact with the probe cartridge 106 installed in the probe driving mechanism 107. When the attachment of the probe cartridge 106 is abnormal, the process returns to step S3101, and the probe cartridge 106 is replaced.

When it is normal, in step S3103, the probe driving mechanism 107 is moved from the replacement position to the measurement position, and then the sample stage 102 is moved so that the tip of the probe enters the scribe area 132 where the TEG for evaluating the electrical characteristics is located.

Subsequently, in step S3104, each attached probe is brought into contact with the electrode pad 3001 for checking the normality of the probe, and the state of the probe is checked. At this time, the contact of each probe with the electrode pad 3001 may be performed by moving the sample stage 102 or coarsely moving the probe driving mechanism 107 to bring the electrode pad 3001 and each probe closer to some extent, and then finely moving the probe driving mechanism 107. Examples of the method of confirming contact between the tip of the probe and the electrode pad includes a method of confirming a change in shape of each probe with an SEM image, a method of sensing the change with a contact sensor attached to each probe, or a method of determining with the weak current flowing through each probe at the time of contact, and any of these may be used. As a result of the normality check, when there is a problem with the probe, the process returns to step S3101 to replace the probe cartridge 106.

When the probe is normal, the process proceeds to step S3105, and the electrical characteristic evaluation apparatus 100 causes the attached probe to contact each electrode pad of the TEG in the scribe area 132 to evaluate the TEG. Also in step S3105, the electrical characteristic evaluation apparatus 100 causes each probe to contact the electrode pad of the TEG in the same manner as the method of contacting the electrode pad 3001 for contact confirmation. After the contact is confirmed, the electrical characteristic evaluation apparatus 100 evaluates the electrical characteristics of the element. When the electrical characteristic evaluation is completed, the electrical characteristic evaluation apparatus 10 retracts the probe from the contact with the electrode pad by the probe driving mechanism 107, and moves to the next measurement position. When the next measurement position is far from the previous measurement position, the sample stage 102 needs to be moved, while when the measurement position is close, the next measurement may be performed by moving the probe 106 by the probe driving mechanism 107.

Subsequently, in step S3106, the electrical characteristic evaluation apparatus 100 waits for an input from an operator as to whether or not to end the measurement. When it is selected not to end, the process returns to step S3103.

Seventh Embodiment

In the present embodiment, an example of the sample holder 105 will be described. It is necessary to minimize, as much as possible, contamination of the semiconductor wafer as the sample 101 held by the sample holder 105. Normally, the semiconductor wafer is held by a mechanical method, while in the present embodiment, the sample holder 105 can be electrostatically chucked, and contamination is reduced by holding the semiconductor wafer as the sample 101 with the sample holder 105 using the electrostatic chuck.

Here, for being electrostatically chucked, the semiconductor wafer as the sample 101 is constantly applied with the voltage, and here, adverse effect may occur when the electrical characteristics of the element or the wiring are measured by bringing the probes of the electrical characteristic evaluation apparatus 100 into contact. Therefore, in the present embodiment, a voltage equal to the voltage applied to the semiconductor wafer as the sample 101, is applied to the probe of the electrical characteristic evaluation apparatus 100, or the voltage is canceled by applying a voltage of the same value but with a sign opposite to that of the voltage value applied to the sample 101 by the electrostatic chuck, so that the electrical characteristics may be measured.

Figure 32A:
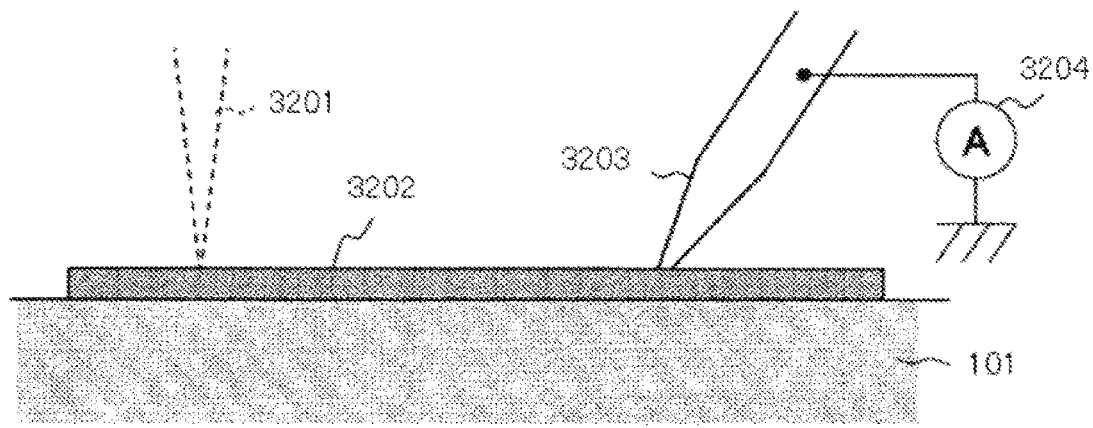
FIG. 32A is a view showing an example of measuring electric characteristics by irradiating a charged particle beam.
Figure 32B:
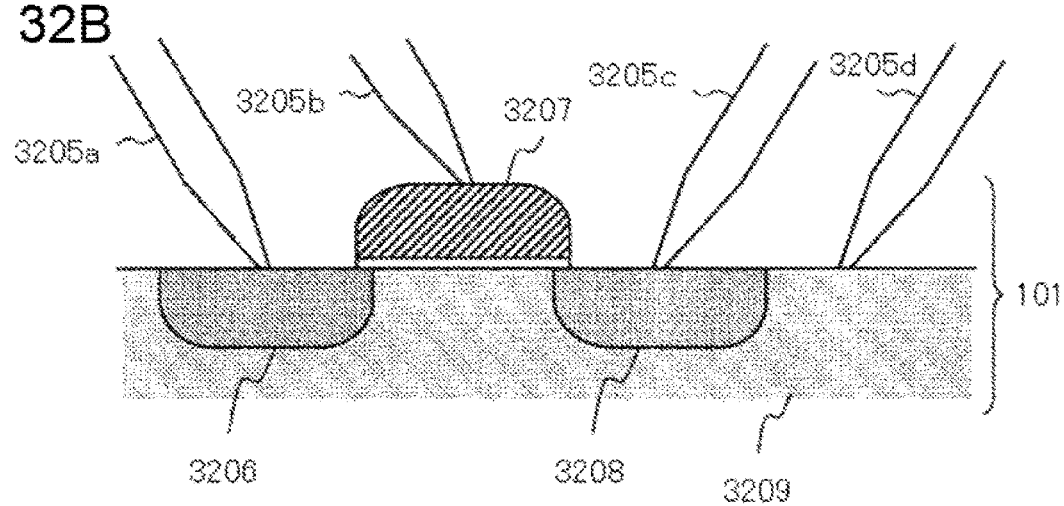
FIG. 32B is a view showing an example of measuring electric characteristics without irradiating a charged particle beam.

Examples of the measuring method of the electrical characteristic evaluation apparatus 100 includes a method of measuring an absorption current and a method of measuring an electric characteristic. FIGS. 32A and 32B are views showing an example of an electrical measurement method by probing with the tip of the probe being in contact with the sample 101. FIG. 32(a) shows an example in which the absorption current of the charged particle beam 3201 from the SEM lens barrel 103 is measured, and FIG. 32(b) shows an example in which the characteristics of a metal oxide semiconductor (MOS) transistor are measured without irradiating the charged particle beam 3201.

In the example of FIG. 32(a), the tip of the probe 3203 of the electrical characteristic evaluation apparatus 100 is brought into contact with one end of the conductive wiring 3202 formed on the semiconductor wafer as the sample 101, and the probe 3203 is grounded, and an ammeter 3204 is provided between the probe 3203 and the ground point. Here, when the finely focused charged particle beam 3201 is irradiated onto the wiring 3202 from the SEM lens barrel 103, the so-called absorption current of the charged particle beam 3201 by the wiring 3201 may be measured based on the output of the ammeter 3204.

Note that the ammeter 3204 is a component included in the current and voltage detection unit 114b, and specifically includes a circuit that detects a voltage corresponding to the absorption current, an amplifier circuit that amplifies the voltage, and the like. Then, the value of the voltage amplified by the amplifier circuit is appropriately converted from analog to digital (A/D) and read by the control computer 114d.

The absorption current is a current obtained based on the charge generated by absorbing the charged particle beam 3201 by the wiring 3202, and generally, it corresponds to a value obtained by subtracting an amount of charge of charged particles reflected or emitted from the wiring 3202, from an amount of charge (beam current) supplied to the wiring 3202 by the charged particle beam 3201 per unit time. Therefore, by measuring the absorption current with the ammeter 3204, the presence of the conduction from the irradiation position of the charged particle beam 3201 to the contact position of the probe 3203 may be known.

Since the charged particle beam 3201 may penetrate through a thin insulation layer or the like, even when the wiring 3202 is covered with an insulation layer or the like, an absorption current may be detected for a wiring of a layer under the same within a range where the charged particle beam 3201 can reach. When the two probes 3203 are brought into contact with wirings at different positions (not shown), the distribution of the resistance value in the wiring connecting the two probes 3203 may be obtained by measuring the absorption current with at least one of the probes 3203.

As shown in FIG. 32(b), when a plurality of (for example, four) probes 3205a to 3205d are brought into contact with the semiconductor wafer as the sample 101, the operating characteristics of an element (for example, a MOS transistor element) or the like formed on the semiconductor wafer as the sample 101 may be acquired without irradiation with the charged particle beam 3201.

In the example of FIG. 32(b), the probe 3205a is brought into contact with a source area 3206, the probe 3205b is brought into contact with a gate electrode 3207, the probe 3205c is brought into contact with a drain area 3208, and the probe 3205d is brought into contact with a substrate area 3209. Therefore, by appropriately applying a voltage to each of the probes 3205a to 3205d and measuring a current flowing between the probe 3205a and the probe 3205c, for example, a gate voltage characteristic of a source-drain current may be acquired. FIG. 32(b) shows an example in which the probes 3205a to 3205d are brought into direct contact with the element, but, even when the probes 3205a to 3205d are brought into contact with the electrode pads connected to the element, the operating characteristics of the element (for example, a MOS transistor element) formed on the semiconductor wafer as the sample 101 may also be acquired without irradiation with the charged particle beam 3201.

FIG. 33 is a view showing an example of an absorption current image (current and voltage image) obtained based on the measurement of the absorption current. The absorption current image 3301 shown in FIG. 33 includes examples of an image of the tip of the probe 3302 of the electrical characteristic evaluation apparatus 100, an image 3303 of the pad electrode contacted by the probe 3302, an image 3304 of the uppermost wiring, and an image 3305 of the wiring of a layer under the insulation layer. As shown in FIG. 33, in the absorption current image 3301, certain images are acquired for the wiring or element in a conductive state with the probe 3302, such as, in the present example, an image 3303 of the pad electrode, an image 3304 of the wiring of the uppermost layer, and an image 3305 of the wiring of a layer under the insulation layer, while no image is acquired for the wiring and element not in a conductive state.

In the absorption current image 3301, an image of the absorption current for the wiring in the layer under the insulation layer (image 3305 of the wiring of the underlayer) may be obtained, as long as the charged particle beam from the SEM lens barrel 103 can reach through the insulation layer. Therefore, in the absorption current image 3301, a wiring structure under the insulation layer, which cannot be observed in a charged particle image such as an SEM image, may be observed nondestructively. The absorption current image 3301 may be displayed on the display device 109.

When the absorption current is acquired, measurement on the semiconductor wafer as the sample 101 to be measured cannot be performed unless the voltage is 0 V. As described above, the semiconductor wafer as the sample 101 is fixed by the electrostatic chuck, so that when a voltage of +V (V) is applied to the surface of the sample, the voltage is canceled by applying a current of −V (V) to the surface of the sample, and the voltage is apparently 0 V at the measurement site on the surface of the sample, thereby allowing measurement of the absorption current.

While the same method may be applied when measuring the electrical characteristics, in the case of measuring the electrical characteristics, typically, two probes are brought into contact with the measurement positions, respectively and a potential difference of 1 V is applied between the two probes such that a current flows therebetween to evaluate the electrical characteristics. Therefore, for example, when a voltage of +V (V) is applied to the upper surface of the semiconductor wafer as the sample 101, a voltage of +V (V) is applied to one probe and a voltage of +V+1 (V) obtained by adding an additional 1 V is applied to the other probe, so that the electrical characteristics may be evaluated.

Eighth Embodiment

In the present embodiment, an example in which the first to eighth embodiments described above are applied to the manufacture of a semiconductor device will be described.

FIG. 34 is a view showing an example of a flow of a front-end process in a manufacturing process of a semiconductor device.

First, in step S3401, an ingot serving as a semiconductor material is pulled up. In step S3402, the ingot is cut using a diamond blade or the like to obtain a wafer. In step S3403, the wafer is polished, and in step S3404, the wafer is placed in a high-temperature diffusion furnace and exposed to an oxidizing atmosphere to form an oxide film on the wafer surface. The oxide film is required for printing a circuit pattern.

In step S3405, a photoresist is applied on the wafer on which the oxide film has been formed. In step 53406, a pattern is formed on the wafer surface. In step S3407, unnecessary oxide films are removed by performing etching. In step S3408, the photoresist that has become unnecessary after the etching is removed by oxidizing plasma, and the wafer is immersed in a chemical solution by a cleaning device to remove impurities remaining on the wafer.

In step S3409, an oxide film is deposited using a CVD apparatus or the like to form an interlayer insulation film. In step S3410, after forming a gate insulation film by a thermal oxidation method, the surface is nitrided, and a gate film is formed thereon using CVD method. Then, after forming the gate electrode by pattern formation, an impurity element is ion-implanted into the silicon substrate by the ion implantation method, and the impurity is further diffused uniformly by high-temperature diffusion to form source and drain areas.

In step S3411, an oxide film is deposited by the CVD method, and the surface is planarized by polishing with a CMP apparatus. Then, etching is performed using the contact hole resist pattern as a mask to form a contact hole in the insulation film. Here, a metal film is buried by the CVD method, and an excess film is removed by CMP polishing. Subsequently, in step S3412, an insulation film is formed again by the CVD method, a pattern is formed, and a portion (trench) to be a wiring is formed. A metal film is buried in the trench, and the excess film is polished and removed. By repeating these processes, a multilayer wiring is formed. Then, the processes from the step S3405 of applying the photoresist to the step S3412 of forming the multilayer wiring are appropriately repeated, whereby the semiconductor wafer having the multilayer wiring is completed.

After completion of the multilayer wiring semiconductor wafer, in step S3413, a wafer inspection is performed, and when it is a non-defective product, the semiconductor wafer having the multilayer wiring is sent to a back-end process of manufacturing a semiconductor device. In the inspection in the front-end process in step S3413, the prober needle is applied to each LSI chip in the wafer, and communication with a connected tester is performed to determine whether the chip is good or defective. Although the back-end process of semiconductor manufacturing is not shown, in general, the wafer is cut for each LSI chip, the cut chip is fixed to a metal lead frame, and the chip and the lead frame are connected to each other by a fine wire, then packaged, printed, and finally inspected to complete the semiconductor product.

Here, even if the wafer has completed the front-end process, when a defect is found during inspection in step S3413, the wafer needs to be discarded. Even when the inspection is performed with the conventional nano-prober inspections disclosed in PTLs 1 to 3, since the measurement is performed by polishing the wafer that has completed the front-end process to expose the wiring in the LSI chip in order to identify and measure a defective portion, the inspected wafer need to be discarded after all. During the inspection, when the wafer is contaminated, the value as a product is lost, and the loss is increased.

Here, when the measurement or inspection is performed using the apparatus or the method described in First to Seventh Embodiments, since the probe is made of a material such as tungsten that is compatible with the semiconductor wafer as the sample 101, the contamination of the wafer may be significantly reduced. Therefore, during the appropriate repetition of the process from step S3405 for applying the photoresist to step 3412 for forming the multilayer wiring described above, the semiconductor wafer may be put into the electrical characteristic evaluation apparatus 100 and subjected to the failure analysis. Therefore, by acquiring electrical characteristics and absorption current images in the manufacturing process of each layer, it is possible to provide early feedback on defects caused by manufacturing equipment and materials during the process, and to reduce the number of defective wafers. For example, in the production process of the transistor layer with the method shown in FIGS. 32A, 32B and 33, the insulation resistance value between different diffusion layer areas is checked, and the resistance value at the end and the end of the gate is measured, so that the quality of spatial manufacturing is electrically confirmed. Although the above has been available only for the length measurement SEM, after the process of the length measurement SEM, by newly adding a check process by the electrical characteristic evaluation apparatus 100, it is also possible to confirm the state of spatial manufacturing by acquiring electrical characteristics, so that the reliability of the manufacturing process can be further increased. In addition to the spatial check, by acquiring the electrical characteristics of the PN junction of the semiconductor and confirming the insulation performance of the gate from other areas by the method shown in FIGS. 32A and 32B, it is possible to find out electrical defects that cannot be determined from the external appearance. With respect to the wiring layers other than the transistor layer, the conduction and insulation of the electrical wiring layer may be confirmed by the electrical characteristic evaluation apparatus 100 that simply measures the resistance between the wiring end and the end and measures the resistance between the wirings. The defective portion of the wiring, such as the disconnection of the wiring or the short circuit between the wirings, may be found as an image by acquiring an absorption current image. With such configuration, the reliability of the device production process can be improved in the sense that the electrical connection can be confirmed as an image by the electrical characteristic evaluation apparatus 100, rather than confirming the line width by the length measurement SEM.

As described above, the spatial confirmation by the length measurement SEM at the time of the process of generating each layer and the electrical confirmation by the electrical characteristic evaluation apparatus 100 are applied in each production process, so that feedback to the subsequent lot is quickly performed, thereby improving the yield of wafers as a whole and reducing the production cost. In the related arts, when some defects are found after the wafer has been completed, the completed wafer has to be discarded since the confirmation work is carried out by polishing for failure analysis, but according to the embodiment described above, it is possible to introduce the electrical characteristic evaluation apparatus 100 into a production process and avoid contamination of the wafer, thereby improving the efficiency of defect analysis in many scenes of a front-end process in a semiconductor device manufacturing process.

REFERENCE SIGNS LIST

100: electrical characteristic evaluation apparatus
101: sample
102: sample stage
103: SEM lens barrel
104: detector
105: sample holder
106: probe cartridge
107: probe driving mechanism
108: controller
109: display device
110: probe exchanger
132: scribe area
141: electrode pad for substrate
142: electrode pad for gate
143: electrode pad for drain
144: electrode pad for source
901: MEMS probe
2201: MEMS probe

The invention claimed is:

1. A probe module, comprising:
a plurality of probes;
a holder for the plurality of probes; and
a conductive layer on a side of the holder opposite to a side on which the plurality of probes are arranged; and
an insulation layer formed on a silicon substrate, wherein
the conductive layer and the plurality of probes are insulated by the insulation layer in a shape recessed from the silicon substrate, and
the plurality of probes are arranged in a fan shape.

2. The probe module according to claim 1, wherein
the number of the probes is four.

3. The probe module according to claim 2, wherein
tips of the four probes are arranged in a fan shape.

4. The probe module according to claim 1, wherein
the plurality of probes are tungsten probes.

5. The probe module according to claim 1, wherein
a surface of the holder opposite to a side facing the sample has conductivity.

6. A probe, comprising:
on one surface of a cantilever, a protrusion formed in the one surface of the cantilever and projecting vertically away from the one surface of the cantilever and including a first metal surface and a first wiring connected to the first metal surface; and
on the other surface of the cantilever, a conductive layer;
wherein the protrusion has a trapezoidal shape including a flat inclined surface having an inclination relative to the cantilever such that the flat inclined surface contacts an electrode pad during bending of the cantilever.

7. The probe according to claim 6, wherein
the protrusion includes a second metal surface electrically separated from the first metal surface, and a second wiring connected to the second metal surface.

8. The probe according to claim 7, wherein
the first and second metal surfaces are in contact with one electrode pad.

9. The probe according to claim 7, wherein
the protrusion includes a third metal surface electrically separated from the first and second metal surfaces, and a third wiring connected to the third metal surface.

10. The probe according to claim 6, wherein
a piezoresistive element is formed on the cantilever.

11. The probe according to claim 6, wherein
the metal is tungsten.

12. A probe, comprising:
a plurality of plate-like metal probes;
a main body that supports the plurality of metal probes;
a conductive layer on a side of the main body opposite to a side on which the plurality of metal probes are arranged;
an insulation layer formed on a silicon substrate; and
wirings connected to the plurality of metal probes on the insulation layer, wherein
the conductive layer and the plurality of metal probes are insulated by the insulation layer in a shape recessed from the silicon substrate, and
tips of the plurality of metal probes are aligned in a substantially straight line.

13. The probe according to claim 12, further comprising:
four of the metal probes.

* * * * *